(12) United States Patent
Yamada

(10) Patent No.: US 7,902,036 B2
(45) Date of Patent: Mar. 8, 2011

(54) METHOD OF FABRICATING SEMICONDUCTOR DEVICE AND THE SEMICONDUCTOR DEVICE

(75) Inventor: Nobuhide Yamada, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 12/485,184

(22) Filed: Jun. 16, 2009

(65) Prior Publication Data

US 2010/0155791 A1   Jun. 24, 2010

(30) Foreign Application Priority Data

Dec. 24, 2008   (JP) .................................. 2008-327577

(51) Int. Cl.
*H01L 21/76* (2006.01)

(52) U.S. Cl. .................. 438/427; 438/435; 257/E21.546; 257/E29.02; 257/E29.255

(58) Field of Classification Search ................... 438/427, 438/435; 257/E21.546, E29.02, E29.255
See application file for complete search history.

(56) References Cited

U.S. PATENT DOCUMENTS

| 5,902,127 A * | 5/1999 | Park ............................. 438/435 |
| 7,358,190 B2 * | 4/2008 | Kim et al. .................... 438/694 |
| 7,402,499 B2 | 7/2008 | Kitamura et al. |
| 2008/0182381 A1 | 7/2008 | Kiyotoshi |

FOREIGN PATENT DOCUMENTS

JP   2006-339446   12/2006

* cited by examiner

*Primary Examiner* — David S Blum
(74) *Attorney, Agent, or Firm* — Oblon, Spivak, McClelland, Maier & Neustadt, L.L.P.

(57) ABSTRACT

A method of fabricating a semiconductor device includes forming trench-like recesses in a semiconductor substrate, the recesses including one or more recesses each of which has an opening width of not more than a predetermined value, forming a first insulating film above the substrate after the recesses have been formed, so that one or a plurality of voids are formed in the one or more recesses whose opening widths are not more than the predetermined value, removing part of the first insulating film so that a beam is left which spans the openings so that the beam passes over upper surfaces of the one or more recesses and so that at least the voids are exposed in a portion of the substrate except the beam, and filling the voids in the recesses with a material with fluidity, thereby forming second insulating films in the recesses.

16 Claims, 17 Drawing Sheets

METHOD OF FABRICATING SEMICONDUCTOR DEVICE AND THE SEMICONDUCTOR DEVICE

CROSS-REFERENCE TO RELATED APPLICATIONS

This application is based on and claims the benefit of priority from the prior Japanese Patent Application No. 2008-327577, filed on Dec. 24, 2008, the entire contents of which are incorporated herein by reference.

BACKGROUND

1. Field

The present invention relates to a semiconductor device configured to have recesses, such as trenches, which are formed on a semiconductor substrate and filled with an insulating film.

2. Related Art

An insulating film is used to fill a recess such as an element isolation trench formed by a shallow trench isolation (STI) process or an interwiring trench in a process of fabricating a semiconductor device. Known filling methods include a thermal chemical vapor deposition (CVD) method, a plasma-enhanced CVD method, a coating method and the like. A width of the recess has been reduced with progress in microstructurization of semiconductor devices. When the recess having a width of not more than 50 nm is filled with a single film by any one of the foregoing filling methods, it is difficult to achieve a balance between a filling characteristic and film characteristics affecting the device structure and properties, such as film stress or drop of breakdown voltage.

The following method has been proposed to overcome the above-described problem in the case of semiconductor memory devices, for example. In the proposed method, a coating film having a better filling characteristic is used in a region where memory cells and the like are formed at a minimum pitch. A combination of the coating film and a CVD film having a better film quality is used in a region where the recess width is larger, for example, a peripheral circuit region.

Japanese Patent Application Publication JP-A-2006-339446 discloses one of the above-described methods, for example. In the disclosed method, an insulating film is formed on an entire surface of a semiconductor substrate formed with element isolation trenches, by the plasma-enhanced CVD method so that voids are formed in the element isolation trenches in the region where memory cells and the like are formed at a minimum pitch and further so that the insulating film covers the bottom and sides of each trench having a larger opening width than the memory cells in the peripheral circuit region. Thereafter, the upper surface of the peripheral circuit region is covered by a resist, and the voids formed in the respective element isolation trenches in the memory cell part are exposed by a dry etching process. Subsequently, the resist is removed and the voids are filled by respective insulating films by the coating method.

However, the above-described method results in the following defect. That is, structure portions have higher aspect ratios than the recesses with further progress in the microstructurization. The structure portions include elements before the filling of recesses with the insulating films and wiring. Moreover, the mechanical strength of the structure portions is reduced since the structure portions have respective small widths. Accordingly, employment of the above-described method results in the following defects: elements, wiring and the like are deformed or broken by an external force such as surface tension of chemical used in an aqueous cleaning process after the forming of element isolation trenches or wiring trenches or stress of a coating film filling the element isolation trench or interwiring space.

SUMMARY

According to one aspect of the present invention, there is provided a method of fabricating a semiconductor device comprising forming a plurality of trench-like recesses in a semiconductor substrate, the recesses including one or more recesses each of which has an opening width of not more than a predetermined value, forming a first insulating film above the semiconductor substrate after the recesses have been formed therein, whereby one or a plurality of voids are formed in said one or more recesses whose opening widths are not more than the predetermined value, the voids being formed along a direction in which the recesses are formed, removing part of the first insulating film so that a beam is left which has a predetermined width and spans the openings so that the beam passes over upper surfaces of said one or more recesses and so that at least the voids are exposed in a portion of the semiconductor substrate except the beam, and filling the voids in the recesses with a material with a predetermined fluidity, thereby forming second insulating films in the corresponding recesses.

According to another aspect of the present invention, there is provided a semiconductor device comprising a semiconductor substrate having a plurality of trench-like recesses formed therein or in a member formed thereon, a first insulating film formed in portions of the respective recesses in a trench-forming direction so as to span openings of the recesses, and a second insulating film formed by filling, with a material having a predetermined fluidity, interiors of the recesses including a region below the portions spanned by the first insulating film.

BRIEF DESCRIPTION OF THE DRAWINGS

FIGS. 16A and 16B to 19A and 19B are schematic sectional views of the first part of structure where no beam is formed and the second part of structure where the beam is formed, respectively, showing sequential fabrication stages;

DETAILED DESCRIPTION

Figure 1:
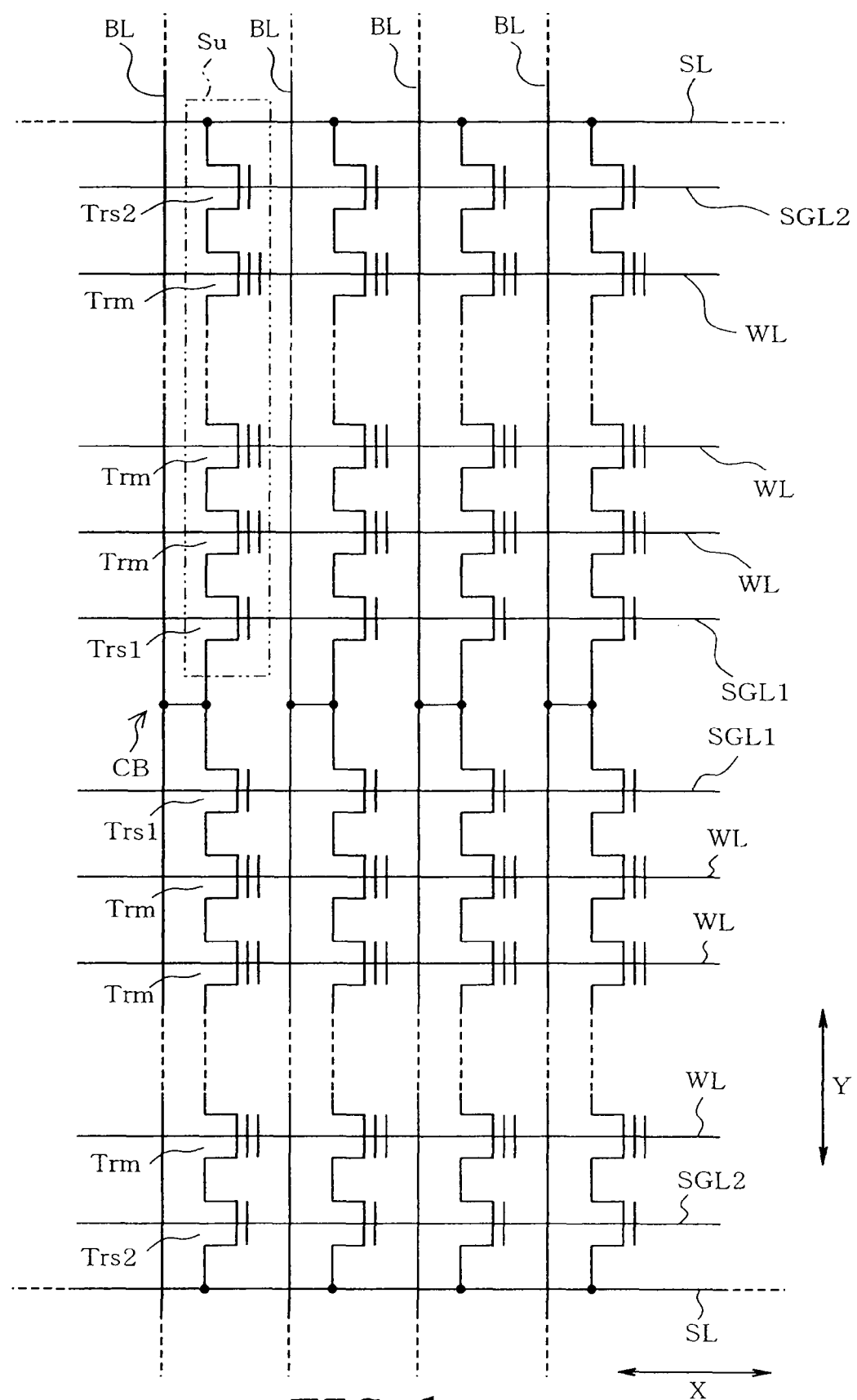
FIG. 1 is an equivalent circuit schematically showing a part of memory cell array of a NAND flash memory of one embodiment in accordance with the present invention.

A first embodiment will be described with reference to FIGS. 1 to 14 of the accompanying drawings. The embodiment is directed to a NAND flash memory provided with floating gate electrodes. Identical or similar parts are labeled by the same reference numerals in the following description. The drawings typically illustrate the embodiments, and the relationship between a thickness and planar dimension, layer thickness ratio and the like differ from respective natural dimensions.

Firstly, the configuration of the NAND flash memory will be described with reference to FIG. 1 showing a part of memory cell array of the NAND flash memory. The memory cell array includes a number of NAND cell units (memory cell units) Su arranged into a matrix. Each NAND cell unit Su comprises two selective gate transistors Trs1 and Trs2 and a plurality of (8 ($2^n$ where n is a positive integer number), for example) memory cell transistors Trm series-connected between the selective gate transistors Trs1 and Trs2. The adjacent memory cell transistors Trm share a source/drain region.

The memory cell transistors Trm in each row of the matrix are aligned in the X direction (corresponding to the direction of word line and the direction of gate width) in FIG. 1 and common-connected to a word line (control gate line) WL. The selective gate transistors Trs1 in each row of the matrix are aligned in the X direction in FIG. 1 and common-connected to a selective gate line SGL1. The selective gate transistors Trs2 in each row of the matrix are also aligned in the X direction in FIG. 1 and common-connected to a selective gate line SGL2. Bit line contacts CB are connected to drain regions of the selective gate transistors Trs1 respectively. The bit line contacts CB are also connected to bit lines BL in the Y direction (corresponding to the direction of gate length and the direction of bit lines) perpendicular to the X direction in FIG. 1. The selective gate transistors Trs2 in each row are connected via source regions to a source line SL extending in the X direction in FIG. 1.

Figure 2:
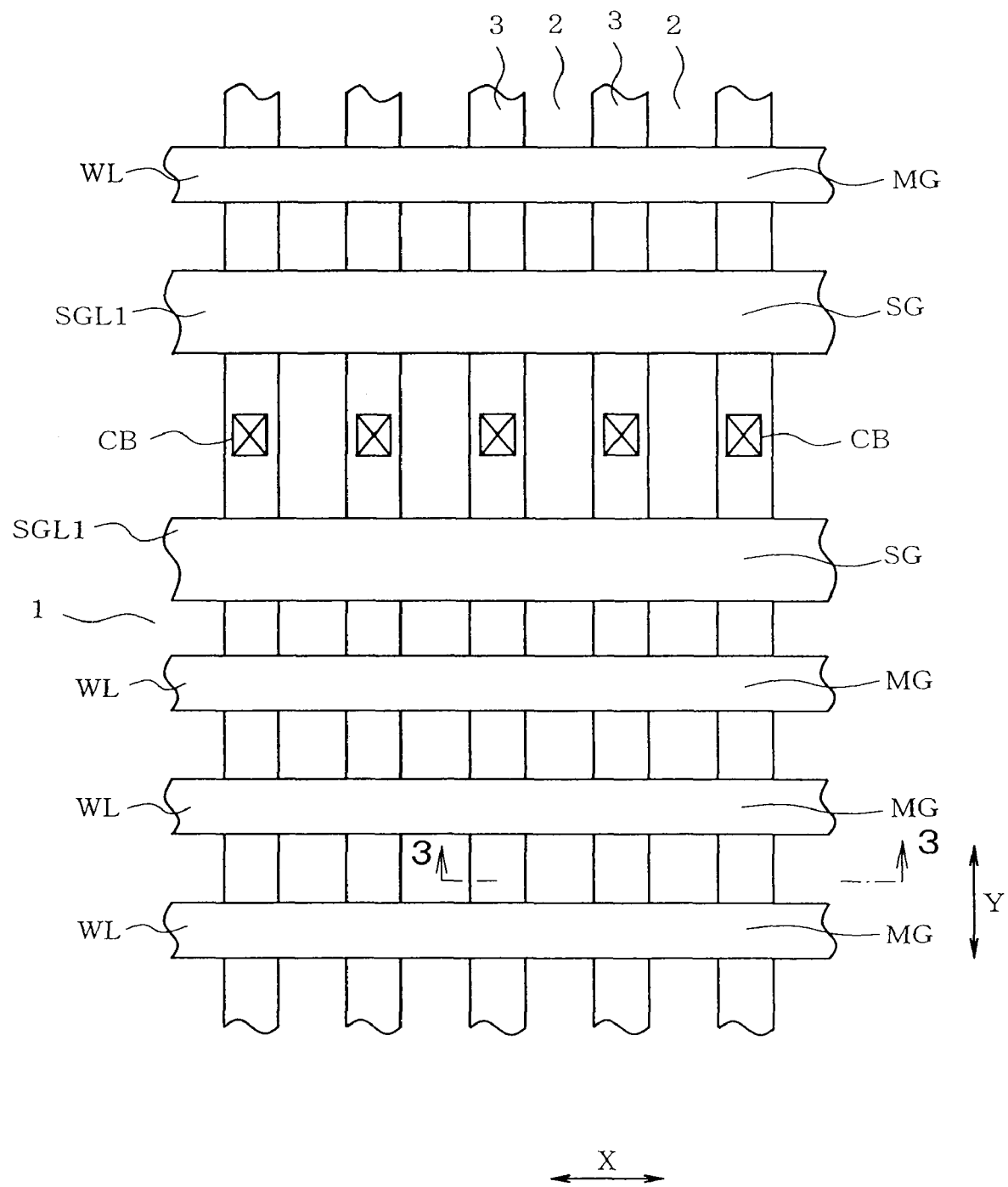
FIG. 2 is a schematic plan view showing the layout pattern of a part of memory cell region.

FIG. 2 shows the layout pattern of a part of memory cell region. In FIG. 2, a plurality of element isolation insulating films 2 are formed so as to extend in the Y direction in a surface layer of a silicon substrate 1 serving as a semiconductor substrate as shown in FIG. 2. The element isolation insulating films 2 are formed by a shallow trench isolation (STI) process so as to be spaced from one another in the X direction in FIG. 2. The surface layer of the silicon substrate 1 is divided by the element isolation insulating films 2 into a plurality of active regions (element formation regions) 3. The word lines WL are formed so as to extend in the X direction perpendicular to the active regions 3. The word lines WL include a plurality of word lines WL spaced from one another in the Y direction in FIG. 2.

A pair of selective gate lines SGL1 are formed so as to extend in the X direction in FIG. 2 and so as to correspond to the paired selective gate transistors Trs1 respectively (see FIG. 1). The bit line contacts CB are formed in respective portions of the active regions 3 located between the paired selective gate lines SGL1. The memory cell transistors Trm have gate electrodes MG formed on portions of the active regions 3 intersecting the word lines WL respectively. The selective gate transistors Trs1 have gate electrodes SG formed on portions of the active regions 3 intersecting the selective gate lines SGL1 respectively.

Figure 3:
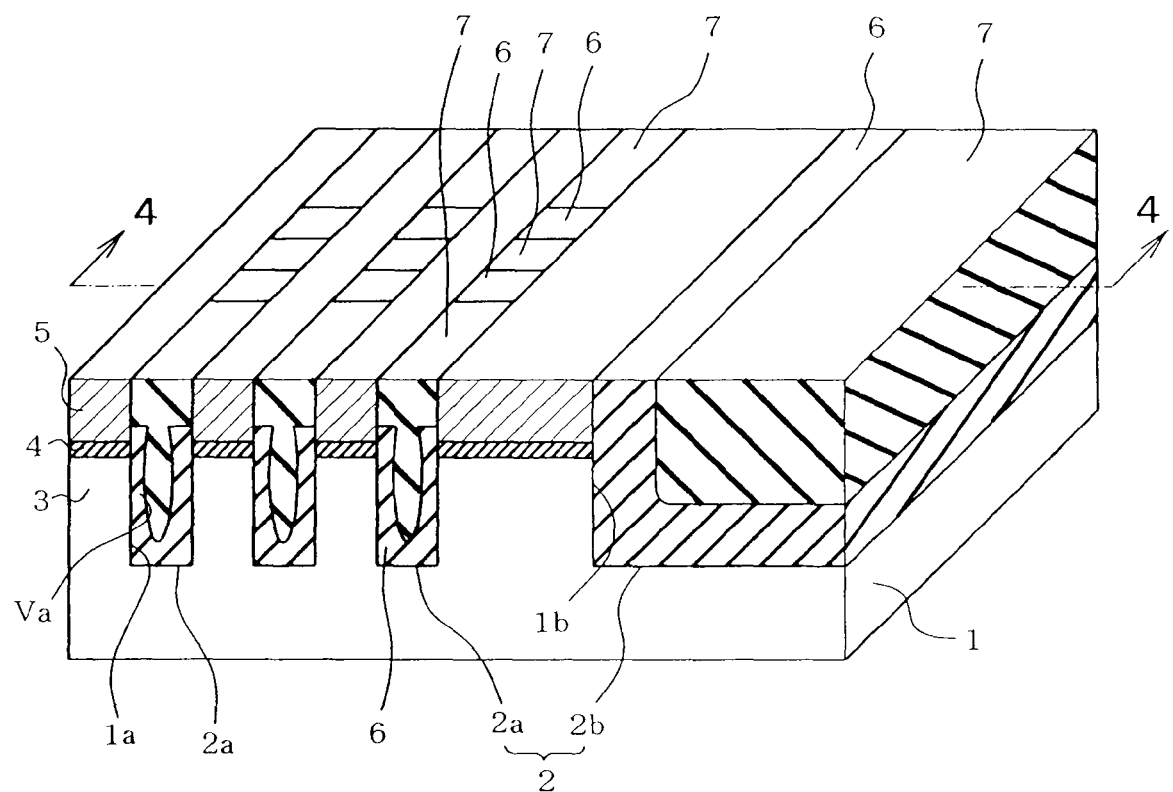
FIG. 3 is a schematic cubic diagram including a section taken along line 3-3 in FIG. 2.

FIG. 3 is a cubic diagram of the structure including a section taken along line 3-3 in FIG. 2. The structure shown in FIG. 3 includes a portion further including element isolation insulating films 2a each having a smaller width corresponding to respective memory transistor forming regions (memory cell regions). The structure also includes another portion including element isolation regions 2b each having a larger width, which is to be formed in a boundary region between the memory transistor forming regions and regions adjacent to the memory transistor forming regions or peripheral circuit regions. FIG. 3 shows the state where the element isolation insulating film 2 has been formed on the silicon substrate 1 and thereafter, a planarizing process has been executed on the surface of the element isolation insulating film 2 so that a predetermined height is reached.

Further referring to FIG. 3, trenches 1a and 1b are formed in the surface layer of the silicon substrate 1 as trench-like recesses having a predetermined depth and different opening widths. The upper surface of the silicon substrate 1 is divided by the trenches 1a and 1b into the strip-shaped active regions 3. The divided active regions 3 include a wider portion corresponding to a boundary region in an end of the memory cell region. The trenches 1a and 1b are filled with element isolation insulating films 2a and 2b each comprising a silicon oxide film respectively. A silicon oxide film 4 serving as a gate insulating film is formed on the upper surface of the active region 3 of the silicon substrate 1. An electrode film 5 is to be formed into a floating gate electrode and is formed on an upper surface of the silicon oxide film 4. Since the active region 3, silicon oxide film 4 and electrode film 5 are processed collectively as will be described later, these region and films have respective sides which constitute a continuous face.

Each of the element isolation insulating films 2a and 2b comprises a first silicon oxide film 6 serving as a first insulating film and a second silicon oxide film 7 serving as a second insulating film. The silicon oxide film 6 is a tetraethyl orthosilicate (TEOS) oxide film, and the silicon oxide film 7 is made from polysilazane which can be used as a coating film with fluidity.

The silicon oxide film 6 is formed in the trenches 1a and 1b in the following manner. The trench 1a has a predetermined opening width equal to or smaller than 50 nm and is filled with the silicon oxide film 6 so that the silicon oxide film 6 reaches a predetermined height from the bottom. The silicon oxide film 6 has an unfilled portion formed in the lengthwise direction of the trench 1a in a central portion of the trench 1a. The unfilled portion forms an inner wall surface Va. The silicon oxide film 6 is formed so as to be also open in an opening of the trench 1a. On the other hand, the silicon oxide film 7 is provided so as to fill a void inside the inner wall surface Va of the silicon oxide film 6 and so as to be stacked on the top of the silicon oxide film 6. The silicon oxide film 7 is thus formed so as to be on the same level as the upper surface of the electrode film 5.

Furthermore, the trench 1b has a larger opening width than the predetermined value (50 nm). The silicon oxide film 6 is formed along sidewall surfaces and bottom in the trench 1b so as to have a predetermined film thickness. The silicon oxide film 6 is not formed in the central portion of the trench 1b, and the silicon oxide film 7 is formed inside the silicon oxide film 6 in the trench 1b. Both silicon oxide films 6 and 7 are formed so as to be on the same level as the upper surface of the electrode film 6. Alternatively, the wider trench 1b may be filled with only the silicon oxide film 6, instead. This case results in difference in the fabrication process as will be described later.

Figure 4:
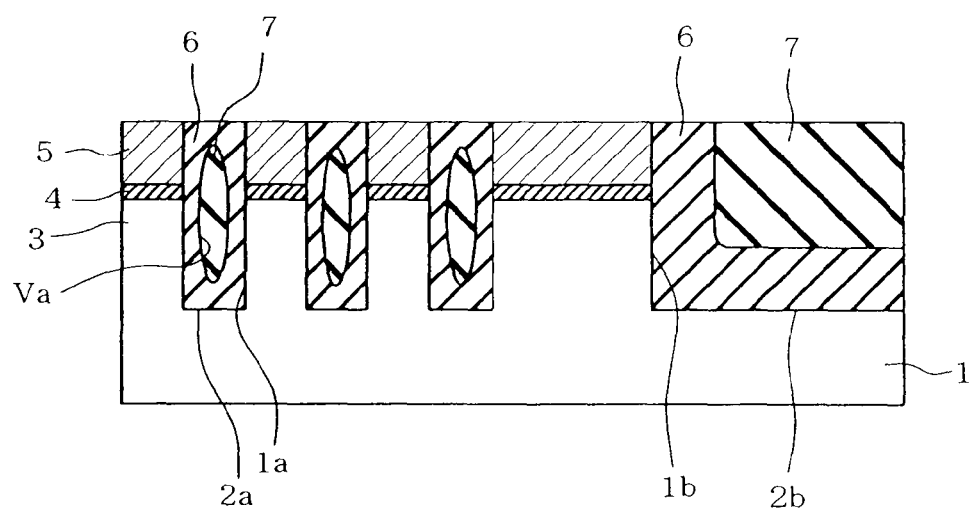
FIG. 4 is a schematic sectional view taken along line 4-4 in FIG. 3.

FIG. 4 shows a section taken along line 4-4 in FIG. 3. The section shown in FIG. 4 differs from the section as shown in FIG. 3. The silicon oxide films 6 and 7 formed in each trench 1a have different shapes from the shapes shown in FIG. 3. The silicon oxide film 6 fills each trench 1a from the bottom to the level of the upper surface of the electrode film 5. The silicon oxide film 6 is not open at the opening of the trench 1a, whereupon the inner wall surface Va of the unfilled portion remains unopened at the upper portion thereof. A void inside the inner wall surface Va of the silicon oxide film 6 in each trench 1a is filled with the silicon oxide film 7. The silicon oxide film 7 is made from the polysilazane as described above. When a polysilazane solution with fluidity is introduced via the open upper portion of the silicon oxide film 6 in each trench 1a, the polysilazane solution is moved laterally such that the void inside the inner wall surface Va of the unopened upper portion is filled with the polysilazane, whereby the silicon oxide film 7 is formed.

In the above-described configuration, the silicon oxide films 6 and 7 located above the electrode film 5 are removed by the chemical mechanical polishing (CMP) process, and the upper surfaces are planarized. The silicon oxide film 6 partially remains in the opening in each trench 1a thereby to span the opening as shown in FIG. 4. This can suppress collapse or deformation of a portion of the active region where the memory cell transistors are to be formed, during the fabrication process.

A fabrication process of the above-described configuration will be described with reference to FIGS. 5 to 14 showing respective steps of the process in addition to FIGS. 3 and 4. FIGS. 5 to 10 illustrate the part of the structure corresponding to FIG. 3. FIGS. 11 to 14 are schematic sections taken along section lines in FIGS. 7 to 10 respectively.

Figure 5:
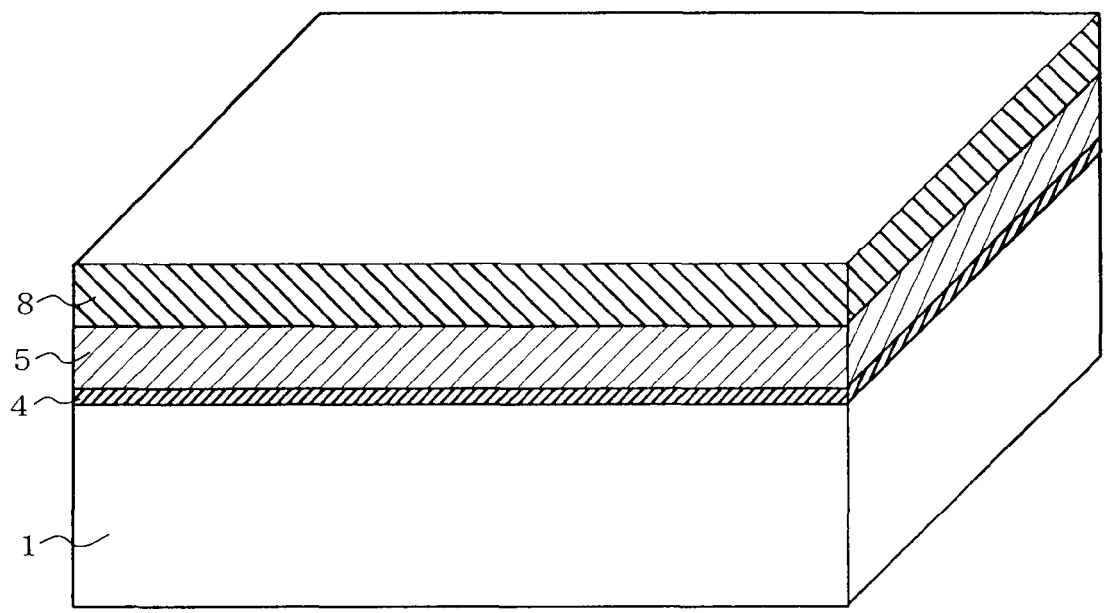
FIGS. 5 to 10 are schematic cubic diagrams of the semiconductor memory device, showing sequential fabrication stages.

Firstly, the silicon oxide film 4 is formed on the upper surface of the silicon substrate 1 as shown in FIG. 5. The silicon oxide film 4 is to be formed into a gate insulating film. The electrode film 5 for the floating gate electrode is then formed on an upper surface of the silicon oxide film 4. The electrode film 5 comprises a polycrystalline silicon film. Furthermore, a processing sacrificial film 8 with a predetermined film thickness is formed on an upper surface of the electrode film 5.

Figure 6:
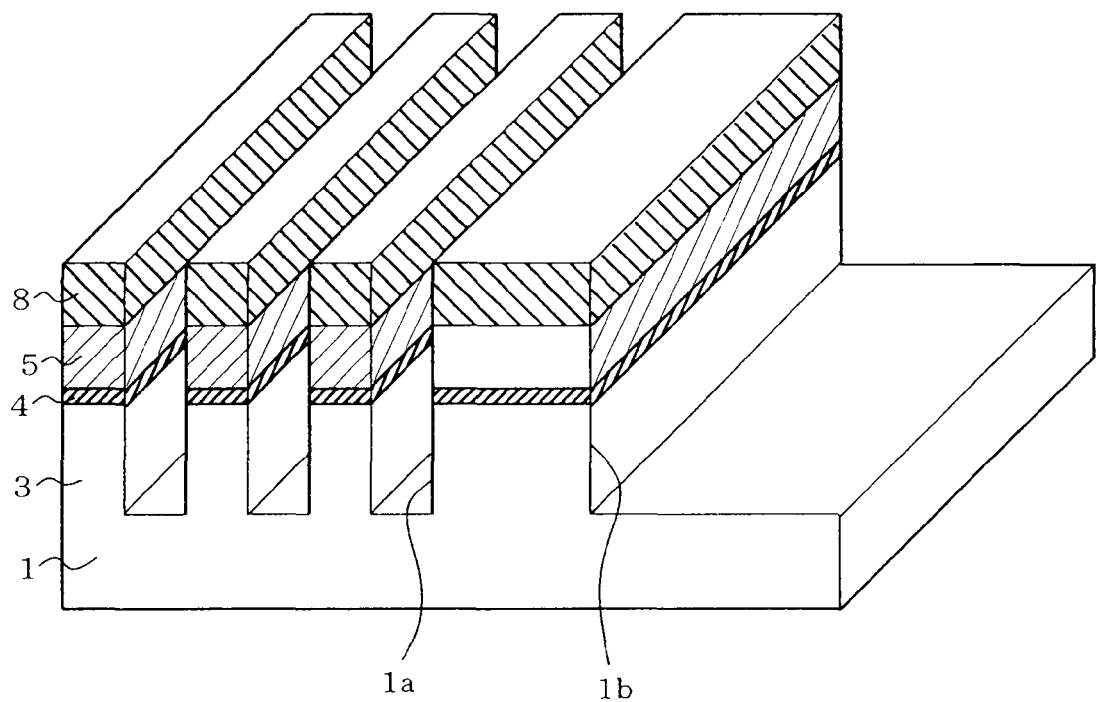

Subsequently, the trenches 1a and 1b are formed so as to reach the silicon substrate 1 as shown in FIG. 6. In this case, resist is firstly patterned by a photolithography process, and the sacrificial film 8 is formed into a hard mask pattern. A reactive ion etching (RIE) process is carried out with the hard mask pattern serving as a mask so that the electrode film 5, silicon oxide film 4 and silicon substrate 1 are etched. The trenches 1a and 1b are formed by etching the electrode film 5, silicon oxide film 4 and silicon substrate 1 so that a predetermined depth is reached in the silicon substrate 1. Each trench 1a has an opening width of not more than 50 nm, whereas the trench 1b has an opening width exceeding 50 nm.

In the above-described state, an upper portion of the silicon substrate 1 in the memory cell region is divided by the narrower trenches 1a into band-shaped divisions. Accordingly, there is a possibility that the divisions of the active region 3 may collapse from respective roots or adjacent divisions may contact each other at the upper portions. Thus, the strength of the structure becomes more unstable as an aspect ratio is increased.

Subsequently, the silicon oxide film 6 serving as a first insulating film is formed on the entire upper surface of the structure by a plasma chemical vapor deposition (CVD) method in which TEOS and oxygen ($O_2$) are used as material gases. In this case, each trench 1a in the memory cell region is formed so as to have the opening width corresponding to the minimum pattern width of the device. The silicon oxide film 6 is formed so that an inner wall surface Va of an unfilled portion defining a void is formed in each trench 1a. Furthermore, the trench 1b is formed so as to have a larger opening width for use as a peripheral circuit region or the like. The silicon oxide film 6 is formed so as to cover the bottom and sidewalls of the trench 1b.

Figure 11:
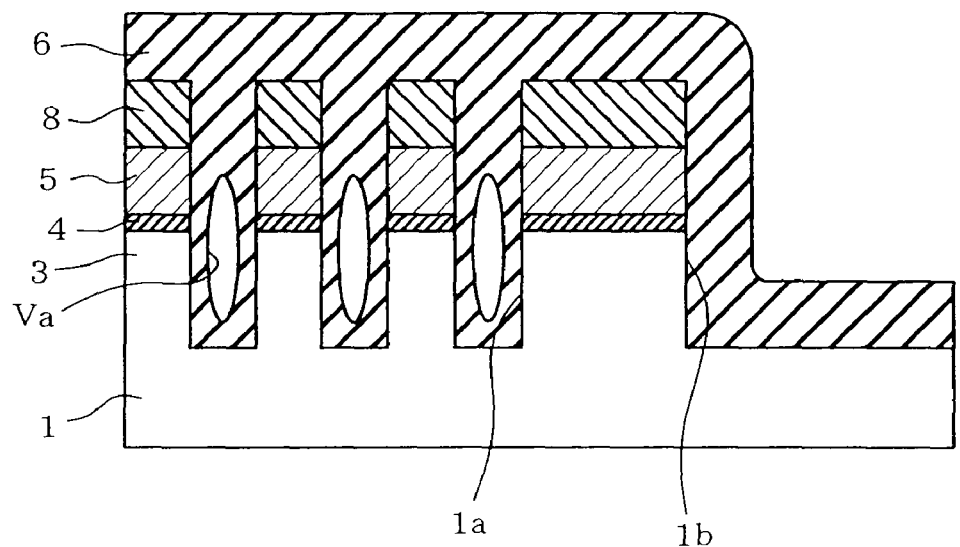
FIG. 11 is a schematic sectional view taken along line 11-11 in FIG. 7.

The silicon oxide film 6 fills the interior of each trench 1a so as to cover the opening of each trench. The inner wall surface Va of unfilled portion in each trench 1a has an upper end located at about the middle of the heightwise dimension of the adjacent electrode film 5. In this state, since each trench 1a is filled with the silicon oxide film 6, there is no possibility of collapse of the band-shaped divisions of the active region 3, whereupon the strength of the structure is rendered more stable as compared with the state in FIG. 6. FIG. 11 shows the section taken along line 11-11 in FIG. 7. In the state of the structure as shown in FIG. 11, the section is the same as the section viewed at the front side in FIG. 7.

Figure 8:
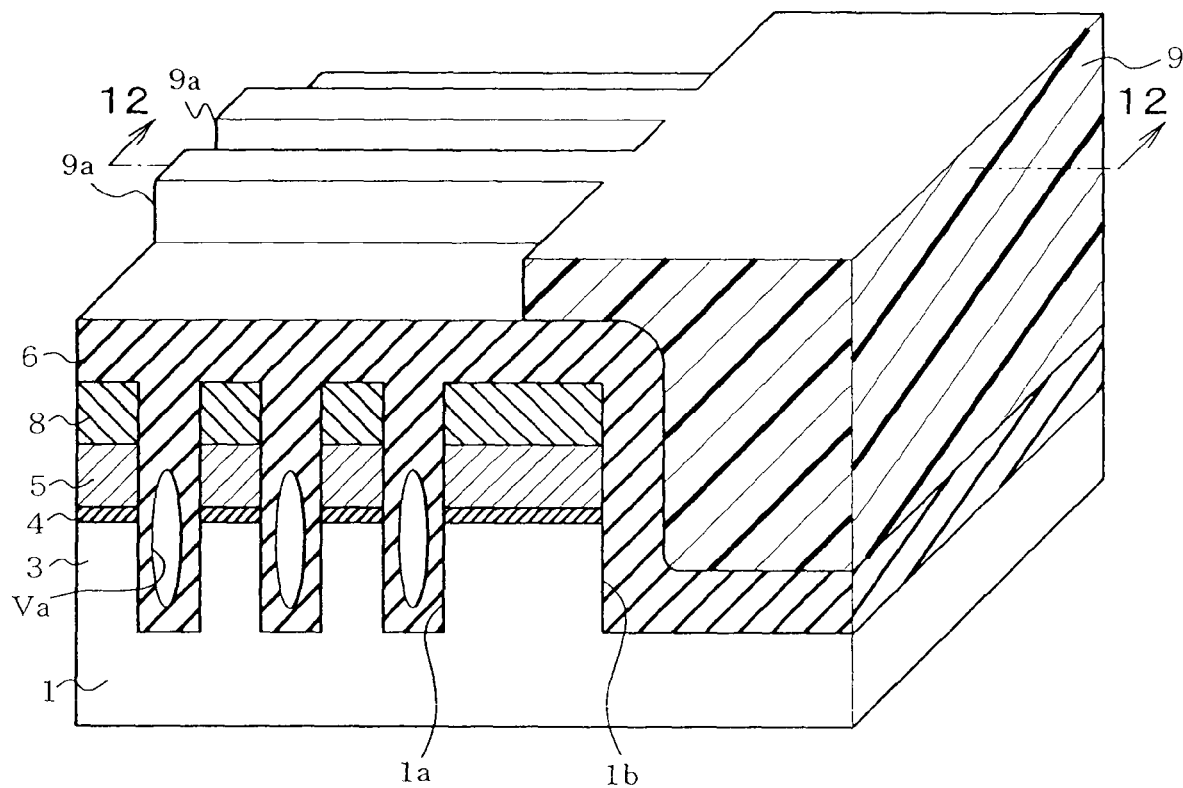
Figure 12:
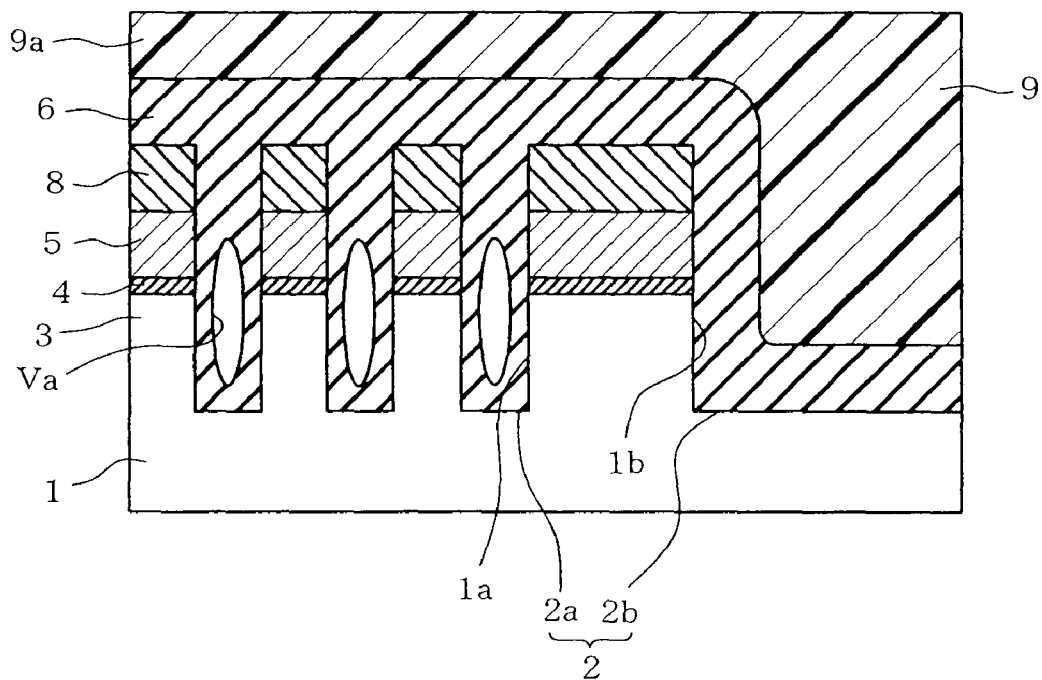
FIG. 12 is a schematic sectional view taken along line 12-12 in FIG. 8.

Subsequently, as shown in FIG. 8, the resist 9 is coated on the upper surface of the silicon oxide film 6 and then patterned by the photolithography process so as to cover the peripheral circuit region and a part of the memory cell region perpendicular to the direction in which each trench 1a is formed. As a result, a pattern of the resist 9a is obtained. Although the resist 9a is formed straightforward thereby to cross the trenches 1a, the resist 9a maybe formed so as to cross the trenches 1a in an oblique direction or so as to span the trenches 1a zigzag in a staircase pattern. The resist 9a may further be formed so that individual portions of the resist 9a connected to the both ends of each trench 1a are disposed checkwise. Additionally, FIG. 12 shows the section taken along line 12-12 in FIG. 8. In the sectional location as shown in FIG. 12, the resist 9a is patterned so as to continuously span the trenches 1a.

Figure 9:
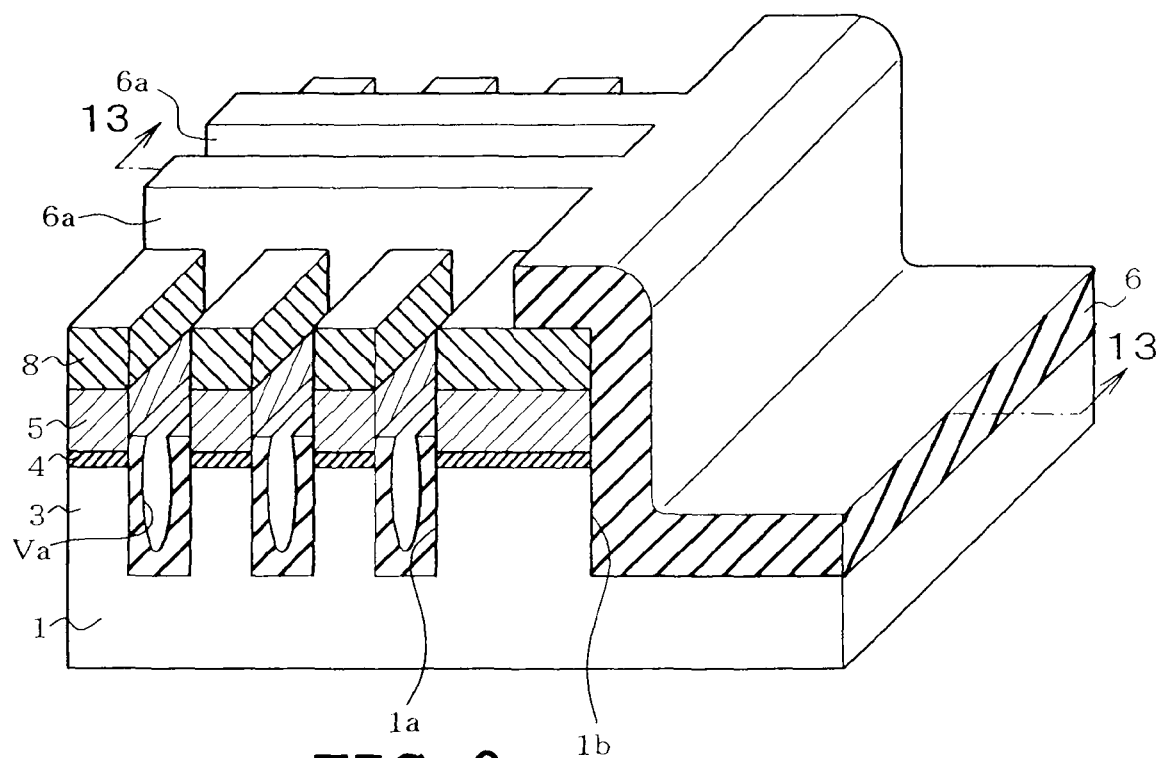
Figure 13:
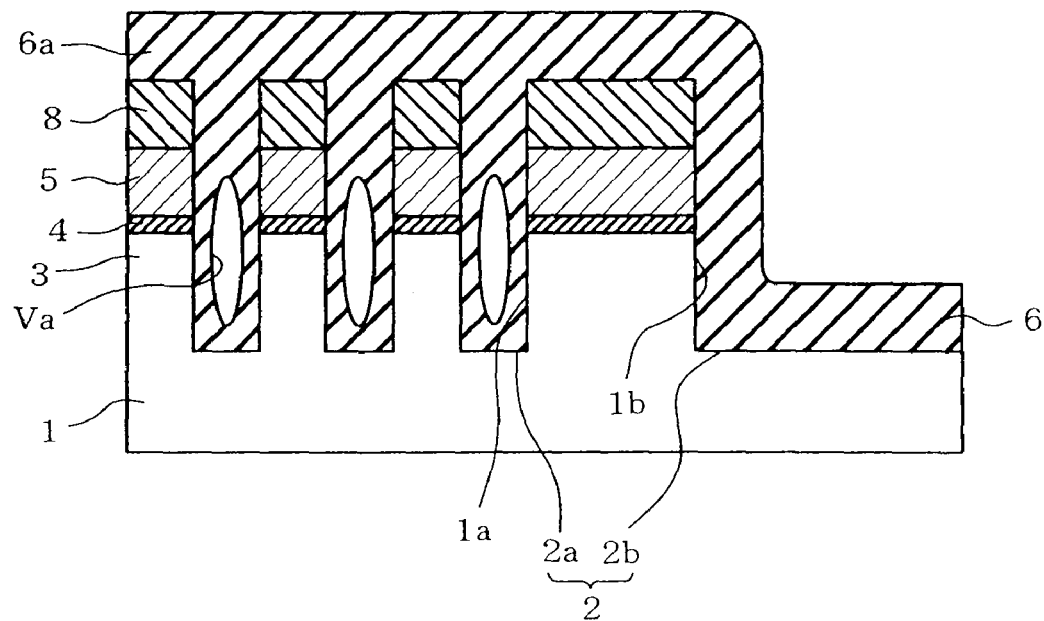
FIG. 13 is a schematic sectional view taken along line 13-13 in FIG. 9.
Figure 14:
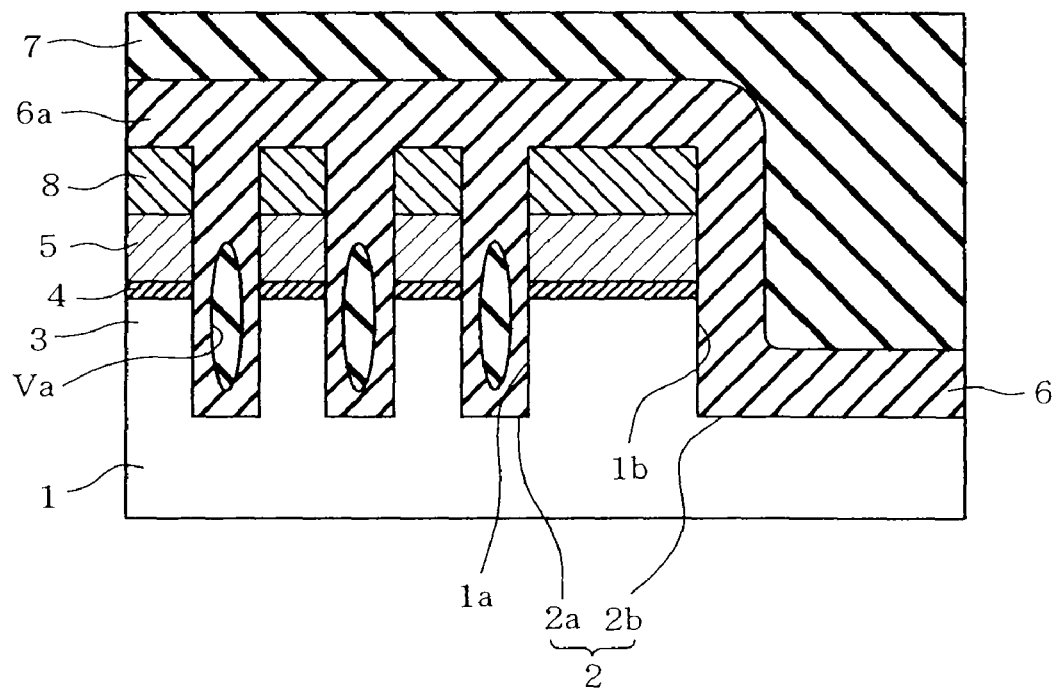
FIG. 14 is a schematic sectional view taken along line 14-14 in FIG. 10.

Subsequently, as shown in FIG. 9, the silicon oxide film 6 is etched with the patterned resists 9 and 9a serving as masks. The etching is continued till the upper ends of the inner wall surfaces Va in the memory cell region are exposed. Consequently, the silicon oxide film 6 in each trench 1a is etched till the etched end is located at about the middle of the heightwise dimension of the adjacent electrode film 5, whereupon the upper end of each inner wall surface Va is exposed such that the inside of each inner wall surface Va is outwardly opened. Thereafter, an ashing treatment is executed to remove the resists 9 and 9a, and a wet treatment is then executed for removal of residues. FIG. 13 shows the section taken along line 13-13 in FIG. 9. In the sectional location as shown in FIG. 13, a part of the silicon oxide film 6 located beneath the resist film 9a remains unetched, thereby serving as beams 6a. The beams 6a span the electrode films 5a and the treating sacrificial films 8 both adjacent to the upper end openings of the trenches 1a. As a result, the inner wall surface Va of the silicon oxide film 6 in each trench 1a remains in a portion of the silicon oxide film 6 located beneath the beams 6a with the upper end thereof being closed. However, since the inner wall surface Va of the silicon oxide film 6 is continuous in the lengthwise direction of each trench 1a, the inner wall surface Va communicates with the outside at a location spaced away from the beams 6a.

In the section including the beam 6a of the silicon oxide film 6 as shown in FIG. 13, the silicon oxide film 6 still remains in the upper end openings of the trenches 1a. Accordingly, the active region of the silicon substrate 1 divided by the trenches 1a is joined together. As a result, even when the trenches 1a are formed with a high aspect ratio, the active region 3 of the silicon substrate 1 is prevented from being isolated, whereupon the strength of the active region 3 can be improved. This can suppress collapse or inclining of the active region 3 portion by the force received by the surface tension of the cleaning chemical in the wet treatment.

The etching depth is set to be equal to about the middle of the adjacent electrode film 5 in the above-described step of etching the silicon oxide film 6. However, the silicon oxide film 6 may be etched deeper than the middle of the adjacent electrode film 5. Furthermore, the entire silicon oxide film 6 in each trench 1a may be etched except for the portion of the silicon oxide film 6 located beneath each beam 6a.

Figure 10:
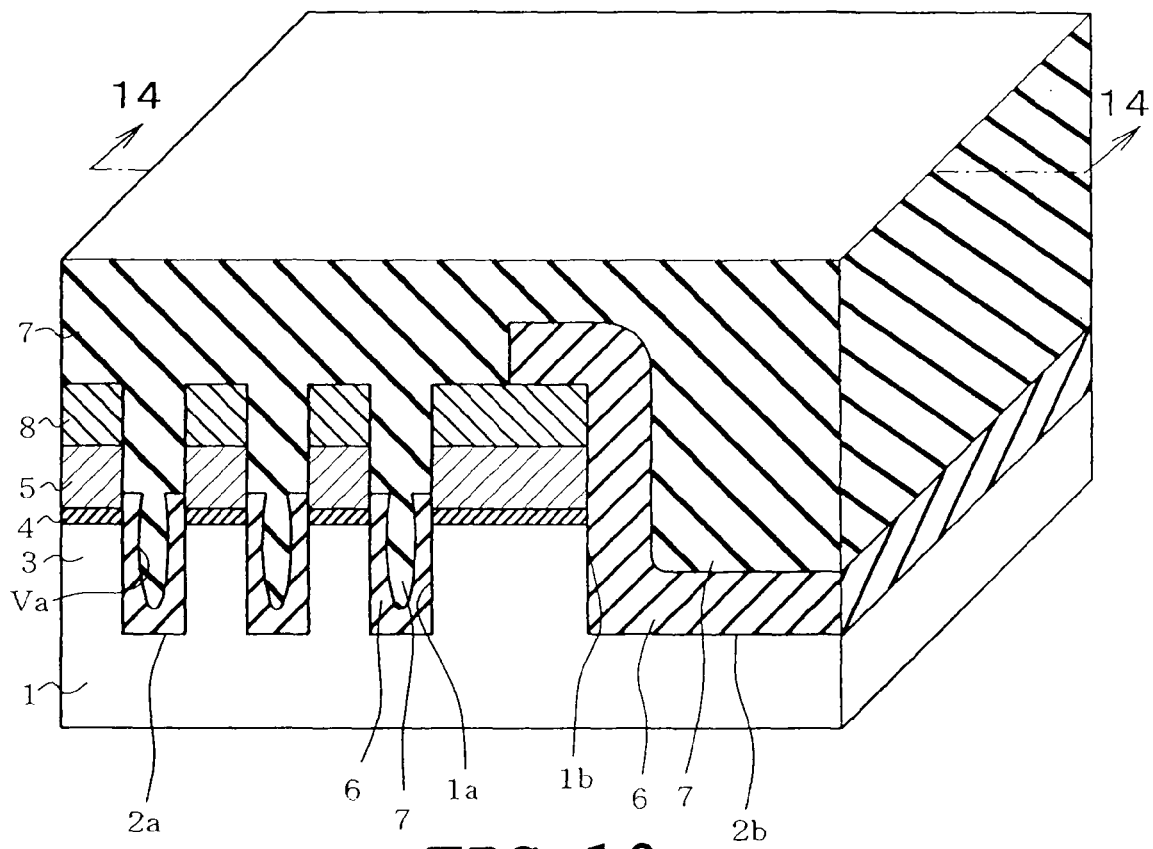

Subsequently, a polysilazane film is formed on the entire upper surface of the structure by a coating method as shown in FIG. 10. The polysilazane film is formed by applying a polysilazane solution and heat-treating the applied polysilazane solution so that the solution is converted to the silicon oxide film 7. In this case, since the polysilazane solution has a high fluidity, the solution can reliably reach the interior of the silicon oxide film 6 where the inner wall surface Va is open in each recess 1a and a recess formed inside the silicon oxide film 6 in the trench 1b.

Furthermore, the polysilazane solution also flows in the lateral direction through the unfilled portion surrounded by the inner wall surface Va of the silicon oxide film 6 in each trench 1a. Consequently, the polysilazane film is formed while filling each void inside the inner wall surface Va located below the beams 6a of the silicon oxide film 6. However, the aforesaid each void inside the inner surface Va may not be filled with the polysilazane film completely. Subsequently, a vapor-phase cure is carried out to remove unnecessary inclusion, so that the polysilazane film is converted to the silicon oxide film 7. In this case, when the silicon oxide film 6 is entirely removed in the etching step except for the silicon oxide film 6 located beneath the beams 6a as described above, each trench 1a as viewed in the front in FIG. 10 is entirely filled with the polysilazane film 7.

The structure is subjected to a film stress of polysilazane during the coating of polysilazane solution and the vapor-phase cure. In this case, since the structure has the above-described beams 6a, collapse or inclining can be suppressed in the portion composing the active region 3 of the memory cell region.

Subsequently, as shown in FIG. 3, excess beams 6a and silicon oxide film 7 formed above the sacrificial film 8 are removed by the chemical mechanical polishing (CMP) process, whereby the structure can be obtained which includes the trenches 1a and 1b filled with the element isolation insulating films 2a and 2b respectively.

Subsequently, the NAND flash memory device is completed through the etching process by the RIE method and an etch-back process applied to the silicon oxide films 6 and 7 in the respective trenches 1a and 1b by the wet treatment, a process of forming an upper layer structure, processes of forming contact holes and wiring layers, and the like.

According to the foregoing embodiment, the trenches 1a and 1b are formed in the silicon substrate 1, and thereafter, the trenches 1a and 1b are filled with the silicon oxide film 6. Regarding each trench 1a, the unfilled portion is positively formed in the silicon oxide film 6, and the coating film, such as polysilazane, having fluidity is applied to the inner wall surface Va of the silicon oxide film 6. The vapor-phase cure is carried out so that the applied polysilazane is converted to the silicon oxide film 7. In this case, part of the silicon oxide film 6 is left thereby to be formed into the beams 6a when the silicon oxide film 6 is etched. Accordingly, collapse or deformation can be suppressed in the component part of the active region 3.

Furthermore, the silicon oxide film 6 is left in each trench 1a so as to span the upper end openings of the trenches 1a even after the structure has been processed by the CMP method into the state as shown in FIG. 3. Accordingly, deformation of the silicon oxide film 7 due to thermal shrinkage can be suppressed when the subsequent thermal treatment is executed.

In the foregoing embodiment, the silicon oxide film 6 serving as the first insulating film is formed so as to have such a film thickness that each trench 1a is filled therewith but that the trench 1b with the larger opening width is not filled therewith completely. In this case, an amount of processing can be reduced in the case of etching or processing by the CMP method. However, the film thickness of the silicon oxide film 6 can be rendered larger than that shown in the foregoing embodiment, and the silicon oxide film 6 can be set to such a large film thickness that the trench 1b is completely filled therewith. Since this can reduce an amount of the silicon oxide film 7 filling the trench 1b with the larger opening width, the effect of reducing a stress generated during thermal treatment can be increased as an amount of the silicon oxide film 7 is reduced.

FIGS. 15A to 19B illustrate a second embodiment. The following will describe only the difference between the first and second embodiments. FIGS. 15A, 16A, 17A, 18A and 19A each correspond to the section as shown in FIG. 3, whereas FIGS. 15B, 16B, 17B, 18B and 19B each correspond to the section as shown in FIG. 4 in the same fabrication process.

Figure 15A:
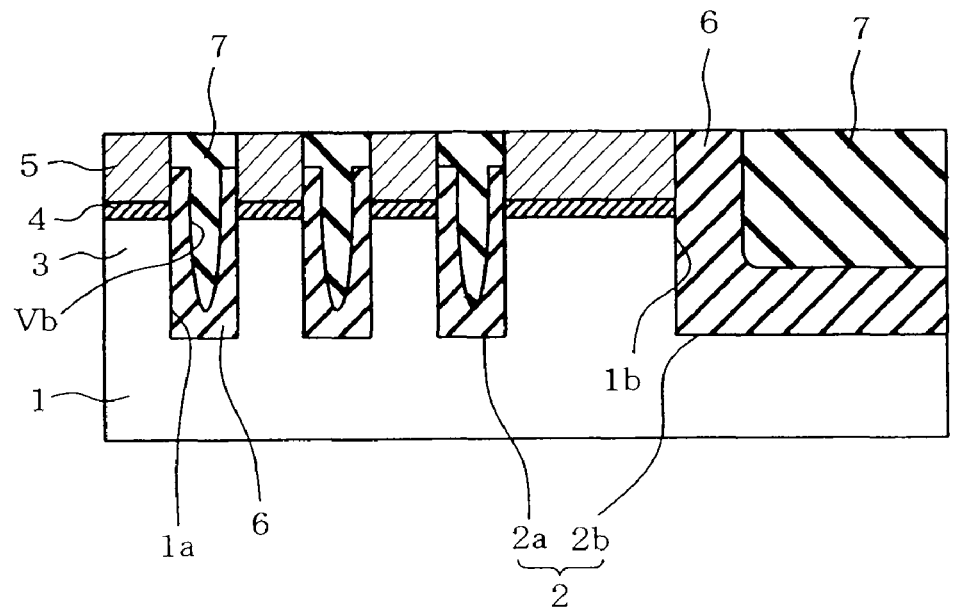
FIGS. 15A and 15B are schematic sectional views of a first part of structure where no beam is formed and a second part of structure where a beam is formed, respectively, showing a second embodiment.
Figure 15B:
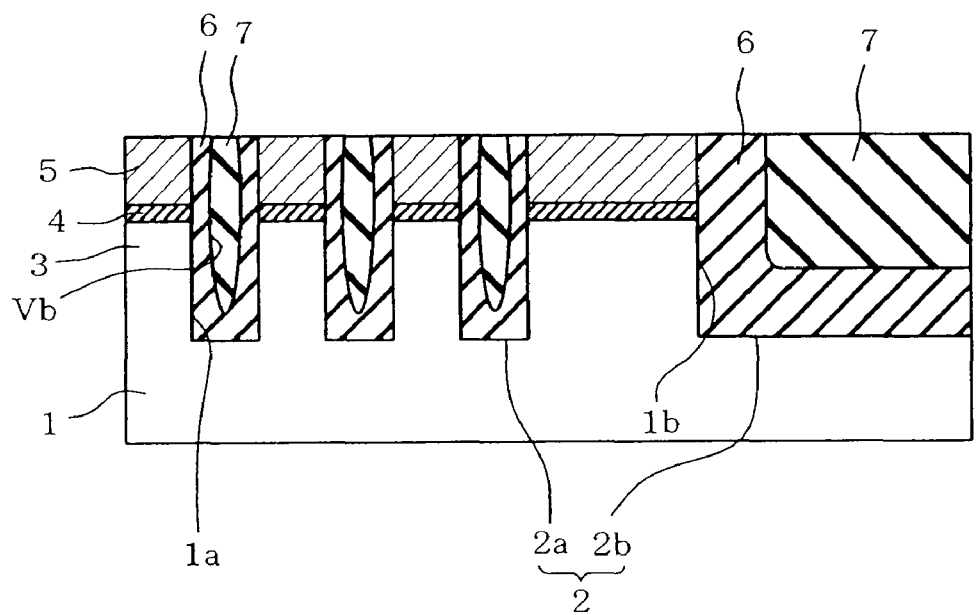

FIGS. 15A and 15B illustrate the respective structures corresponding to the step of the fabrication process as shown in FIG. 3. FIG. 15A shows the part of the structure in which no beams of the silicon oxide film 6 are formed on the upper part of the structure. The configuration as shown in FIG. 15A is substantially the same as that of the first embodiment. Furthermore, the configuration as shown in FIG. 15B corresponds to a part of the structure located below the beams. The inner wall surface Vb formed in the unfilled portion of each trench 1a is open at the upper end in the configuration as shown in FIG. 15B.

Figure 7:
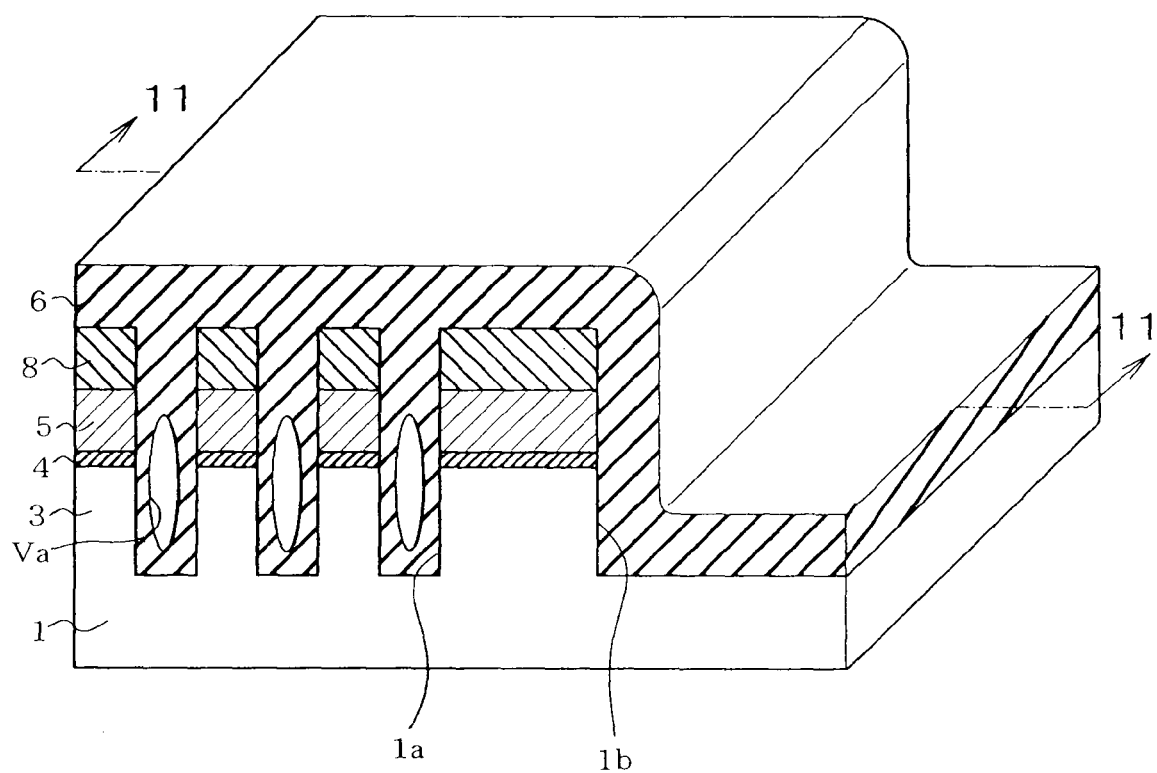
Figure 16A:
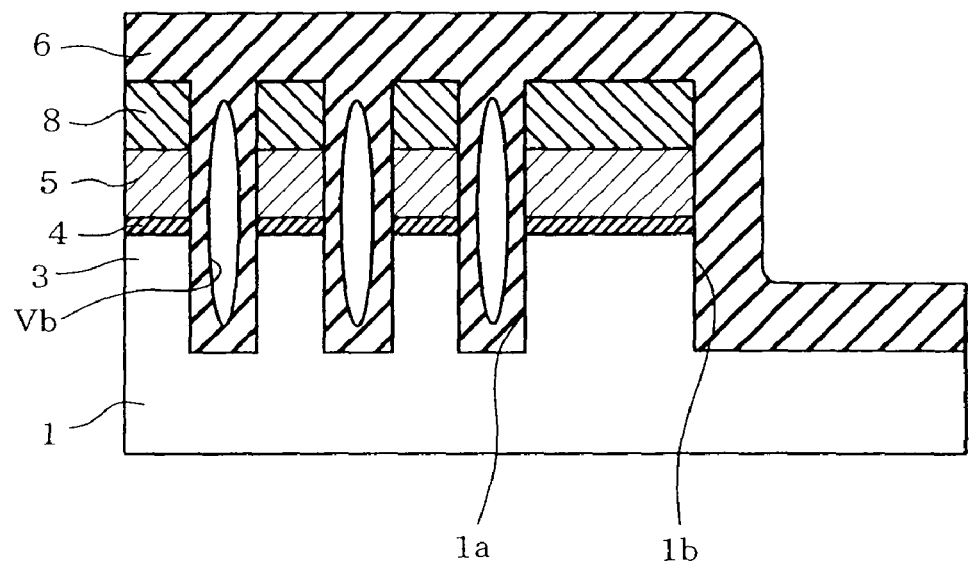
Figure 16B:
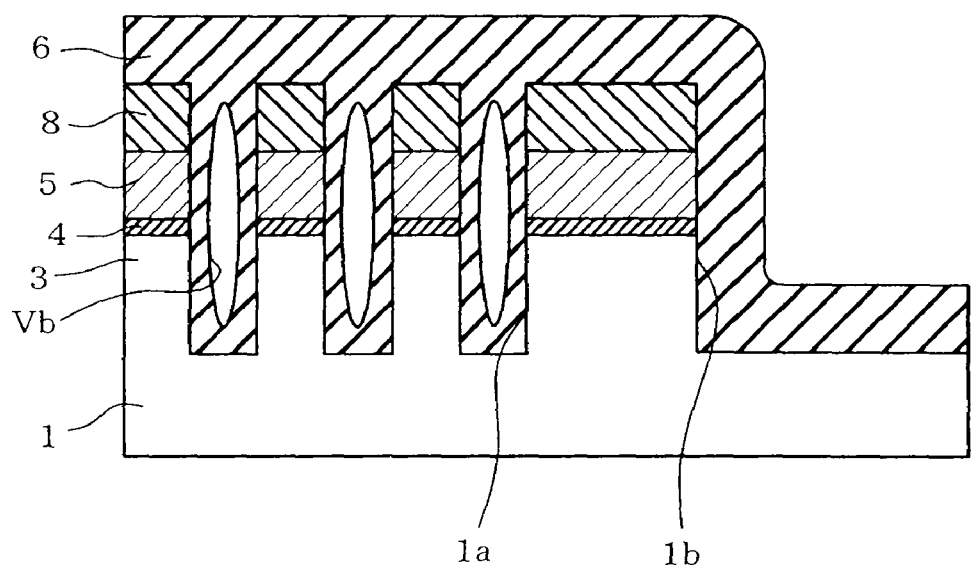

FIGS. 16A to 19B show steps of the fabrication process. FIGS. 16A and 16B correspond to the step as shown in FIG. 7 in the first embodiment. As shown in FIGS. 16A and 16B, the trenches 1a and 1b are filled with the silicon oxide film 6 so that the inner wall surface Vb of the silicon oxide film 6 in each trench 1a has an upper end located about at the middle of the heightwise dimension of the sacrificial film 8.

Figure 17A:
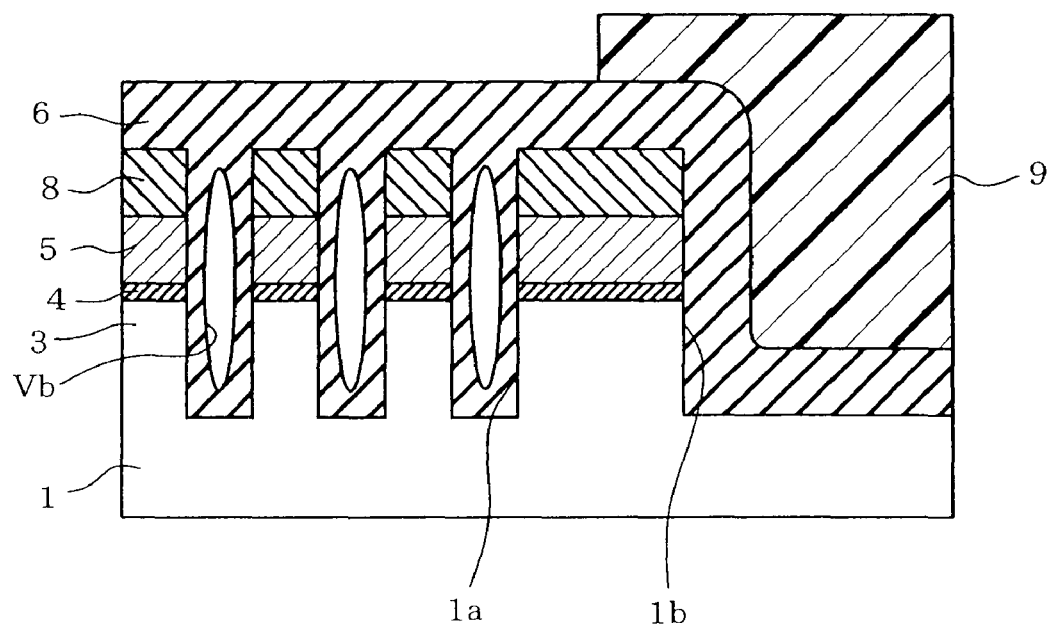
Figure 17B:
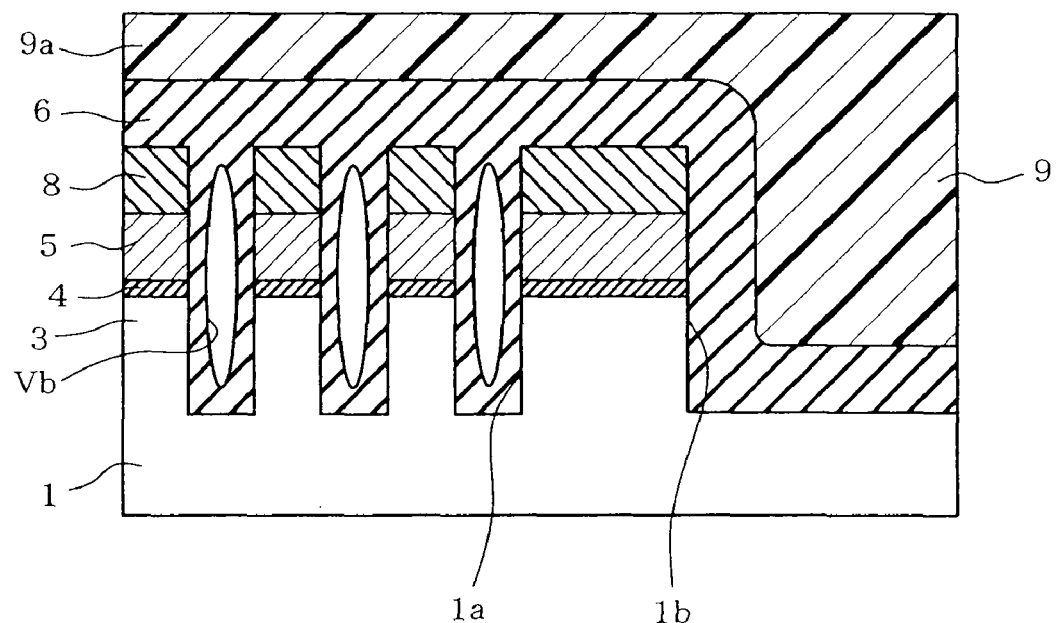
Figure 18A:
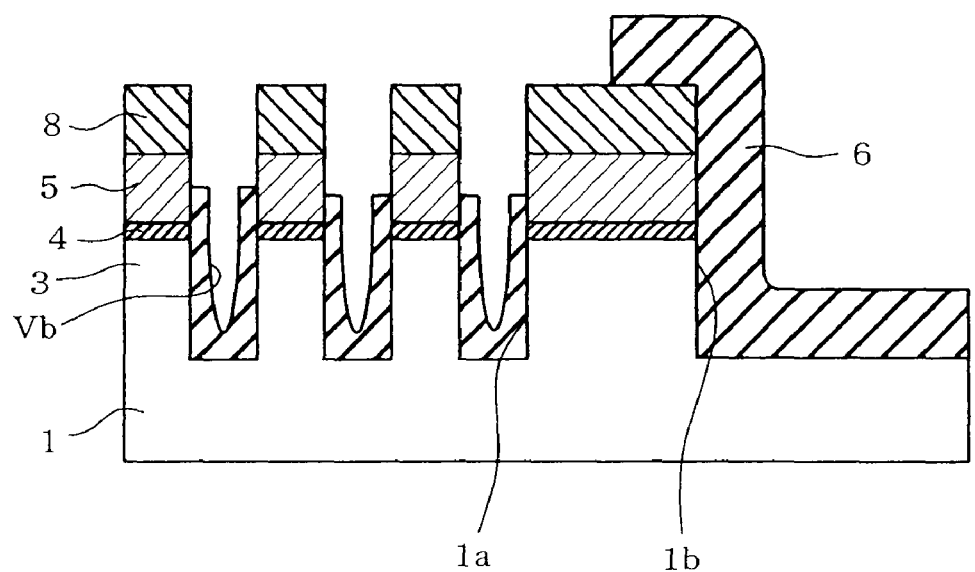
Figure 18B:
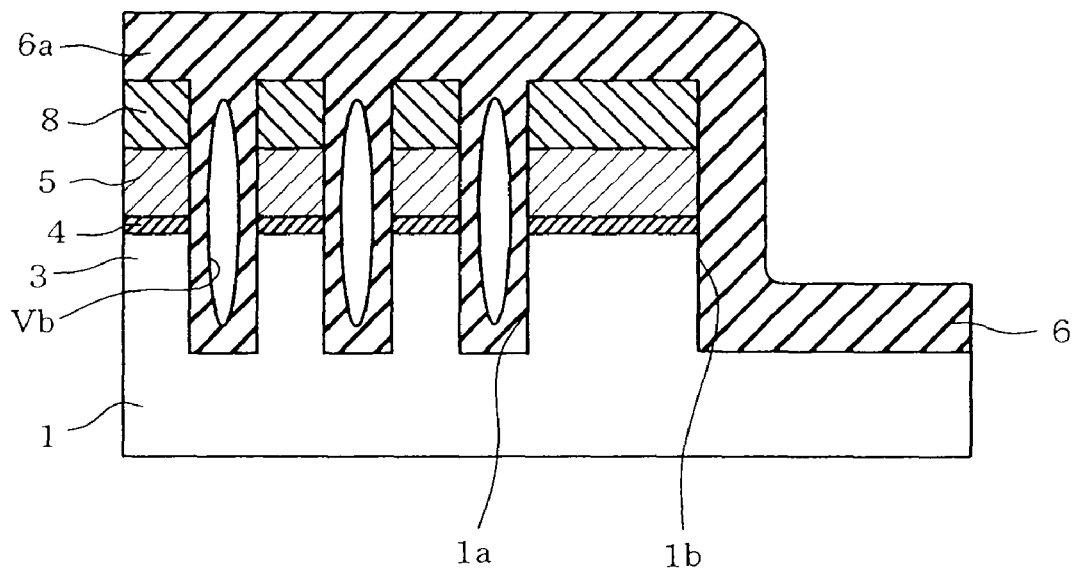

Subsequently, the resist 9 is patterned by the photolithography process as shown in FIGS. 17A and 17B. Part of the resist 9 located on the memory cell region is removed as shown in FIG. 17A. The part of the resist 9 located on the memory cell region is patterned so that the resist 9a is formed across the trenches 1a. Subsequently, as shown in FIGS. 18A and 18B, the silicon oxide film 6 is etched by the RIE method with the resists 9 and 9a serving as masks such that a predetermined depth is reached. In this case, the upper portion of the inner wall surface Vb of the silicon oxide film 6 is opened in the part of the structure as shown in FIG. 18A. The silicon oxide film 6 remains unetched such that the beams 6a are formed, in the part of the structure as shown in FIG. 18B.

Figure 19A:
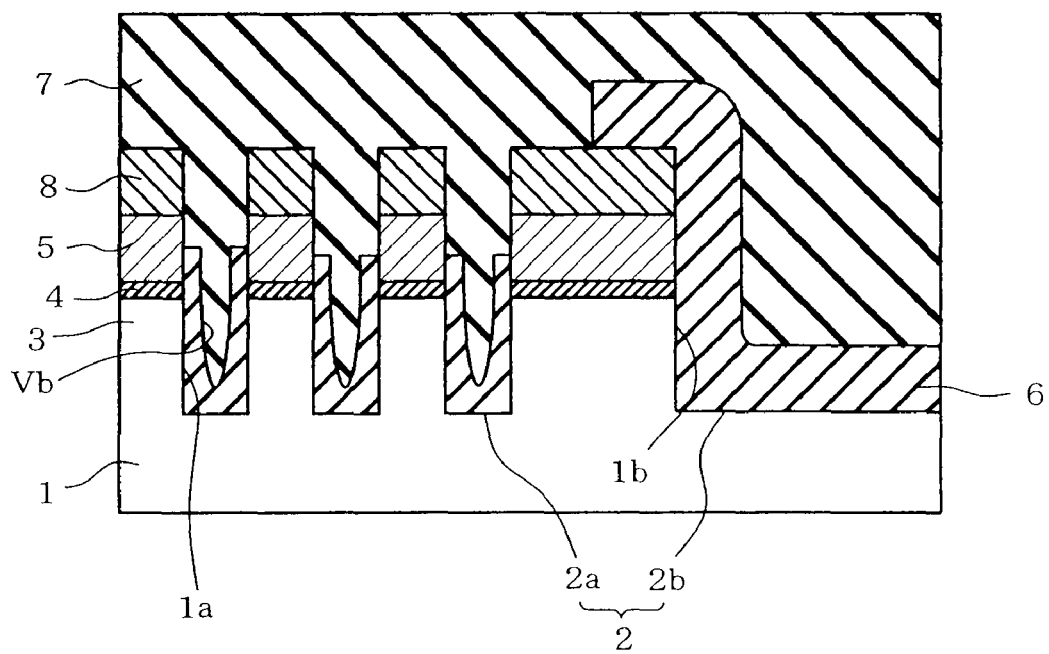
Figure 19B:
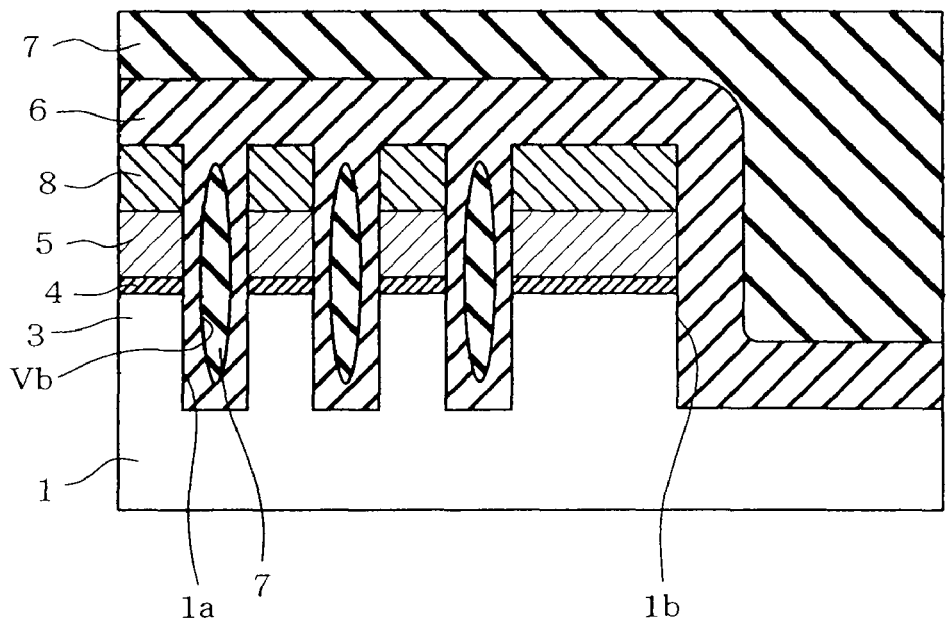

Subsequently, the polysilazane solution is applied to the structure to be formed into the polysilazane film. Thereafter, the vapor-phase cure is carried out so that the polysilazane film is converted to the silicon oxide film 7. In this case, since the polysilazane solution has a predetermined fluidity, the polysilazane solution penetrates the inside of the inner wall surface Vb of the silicon oxide film 6, whereupon the trenches 1a and 1b are reliably filled with the polysilazane solution, as shown in FIG. 19A. Furthermore, as shown in FIG. 19B, the inside of the inner wall surface Vb is filled with the polysilazane solution as the result of lateral flow below the beams 6a of the silicon oxide film 6. Accordingly, the structure is formed with the trenches 1a and 1b being filled with the silicon oxide film 7 after execution of the vapor-phase cure. Thereafter, when the CMP process is carried out to remove the silicon oxide films 6 and 7, the configuration as shown in FIGS. 15A and 15B is obtained.

In the above-described second embodiment, too, part of the silicon oxide film 6 remains unetched when the silicon oxide film 6 is etched, thereby being formed into the beams 6a. Consequently, collapse or deformation can be suppressed in the active region 3 even when the component part of the active region 3 is subjected to stress in the subsequent treatment.

Figure 20A:
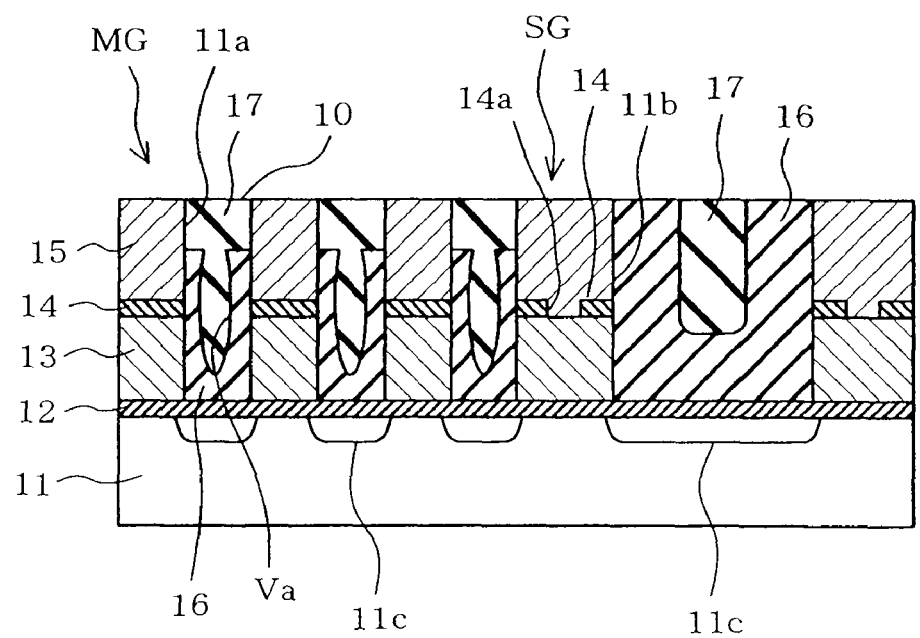
FIGS. 20A and 20B are schematic sectional views of a first part of structure where no beam is formed and a second part of structure where a beam is formed, respectively, showing a third embodiment.

FIGS. 20A to 21B illustrate a third embodiment. The third embodiment differs from the first embodiment in that the third embodiment is directed to a process of forming gate electrodes in a NAND flash memory device provided with floating gate electrodes. FIGS. 20A and 21A each correspond to the section as shown in FIG. 3, whereas FIGS. 20B and 21B each correspond to the section as shown in FIG. 4 in the same fabrication process.

Figure 20B:
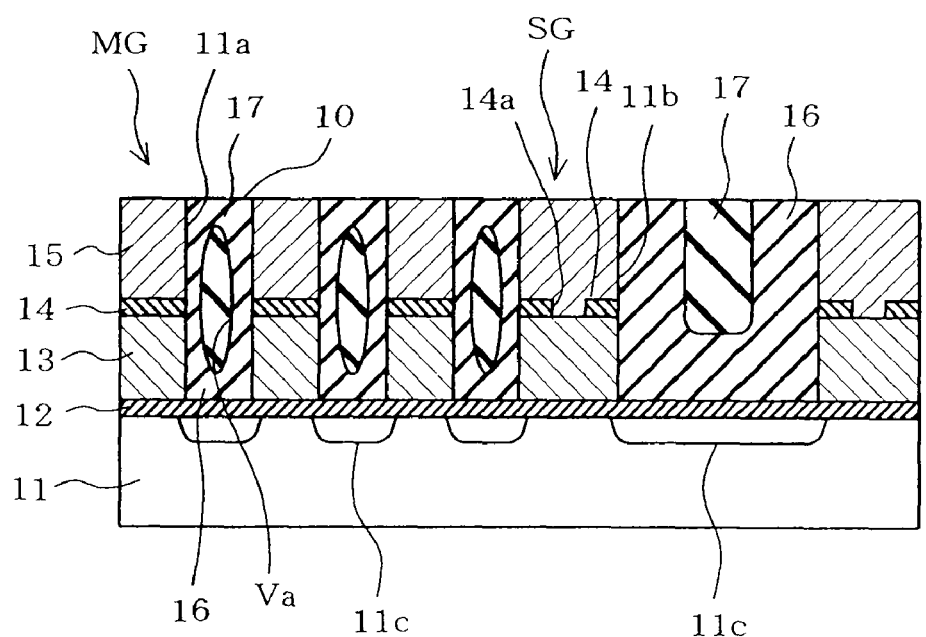

FIGS. 20A and 20B illustrate the respective structures corresponding to the step of the fabrication process as shown in FIG. 3. Gate electrodes MG constituting the respective word lines WL, and selective gate electrodes SG are formed. The trenches between the adjacent gate electrodes MG are filled with silicon oxide films 16 and 17 serving as first and second insulating films, and the silicon oxide films 16 and 17 are formed into interlayer insulating films 10. A gate insulating film 12 is formed on an upper surface of part of the silicon substrate 11 to be formed into the active region. The selective gate electrodes SG are formed on an upper surface of the gate insulating film 12 so as to be adjacent to the respective gate electrodes MG and contact region. Impurities are introduced into the active regions of the silicon substrate 11 between the gate electrodes MG and selective gate electrodes SG, so that source/drain regions 11c are formed.

Each gate electrode MG comprises a floating gate electrode 13 further comprising a polycrystalline silicon film (a lower layer), an intergate insulating film 14 further comprising an oxide-nitride-oxide (ONO) film, and a control gate electrode 15 further comprising a polycrystalline silicon film and silicide film, all of which are sequentially stacked one upon another. The intergate insulating film 14 constituting each selective gate transistor SG is formed with a slit-like opening 14a, through which the floating gate electrode 13 and the control gate electrodes 15 are electrically conducted. A region between the adjacent gate electrodes MG and a region between the gate electrode MG and the selective gate electrode correspond to the structure corresponding to the recess 11a and are formed at predetermined intervals (of not more than 50 nm). A region between two selective gate electrodes SG has a larger width exceeding 50 nm and is formed into a recess 11b. The recess 11b corresponds to a region where a contact is to be formed.

Silicon oxide films 16 and 17 serving as interlayer insulating films are formed in each of the recesses 11a and 11b. In each recess 11a, the silicon oxide film 16 is formed so as to extend from the bottom substantially to the location at the middle of the heightwise dimension of the control gate electrode 15 along most of the dimension in the direction of word line WL. An unfilled portion serving as void is formed in a central part of each recess 11a. Each unfilled portion has the inner wall surface Va having an upper open end. The silicon oxide film 17 is formed on the upper surface of the silicon oxide film 16 so as to be on the same level as the control gate electrode 15. In the recess 11b, a silicon oxide film 16 having a predetermined film thickness is formed so as to extend along the bottom and sidewalls of the recess. The centrally left recess is filled with the silicon oxide film 17.

The silicon oxide film 16 is formed by a thermal CVD method in which TEOS and ozone ($O_3$) are used as material gases. The unfilled portion is formed in each recess 11a depending upon film-forming conditions, whereby the inner wall surface Va is formed. Furthermore, the silicon oxide film 17 is formed by a condensation CVD method (or a flow CVD method). More specifically, the silicon oxide film 17 is formed by filling the void inside the inner wall surface Va and the recess 11b with a material in a fluid state and subsequently by thermal application. In the condensation CVD method, a liquid-phase film is formed on the silicon substrate under the condition where the material or reactive intermediate product is at or below the boiling point or in equilibrium with vapor phase. Thereafter, heat is applied to the liquid-phase film so as to span the trenches, whereby the silicon oxide film is obtained as a stable film.

Figure 21A:
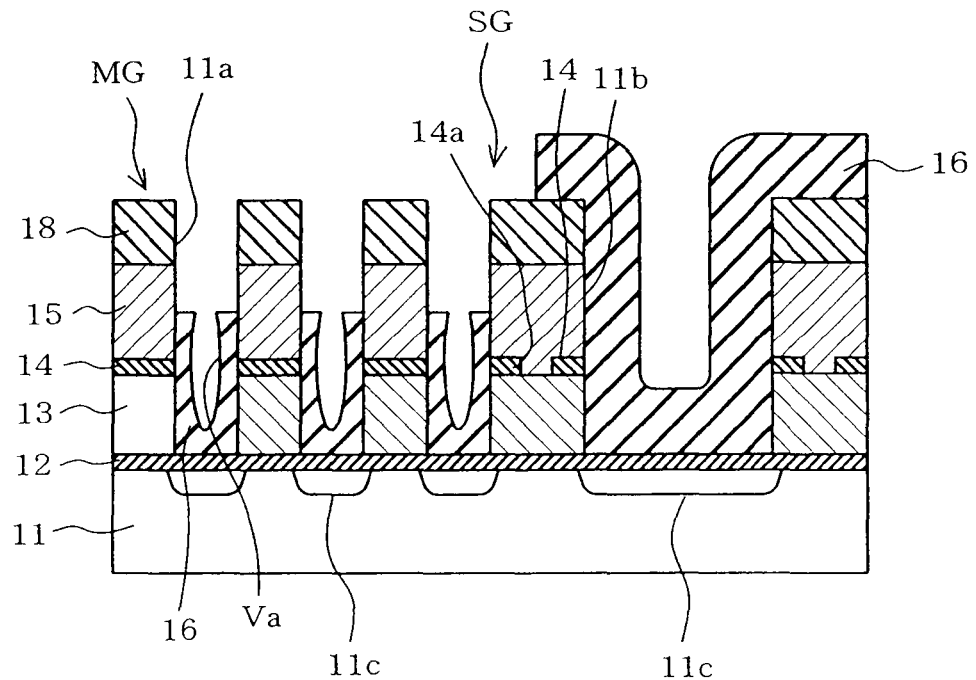
FIGS. 21A and 21B are schematic sectional views of the first part of structure where no beam is formed and the second part of structure where the beam is formed, respectively, showing a fabrication stage.
Figure 21B:
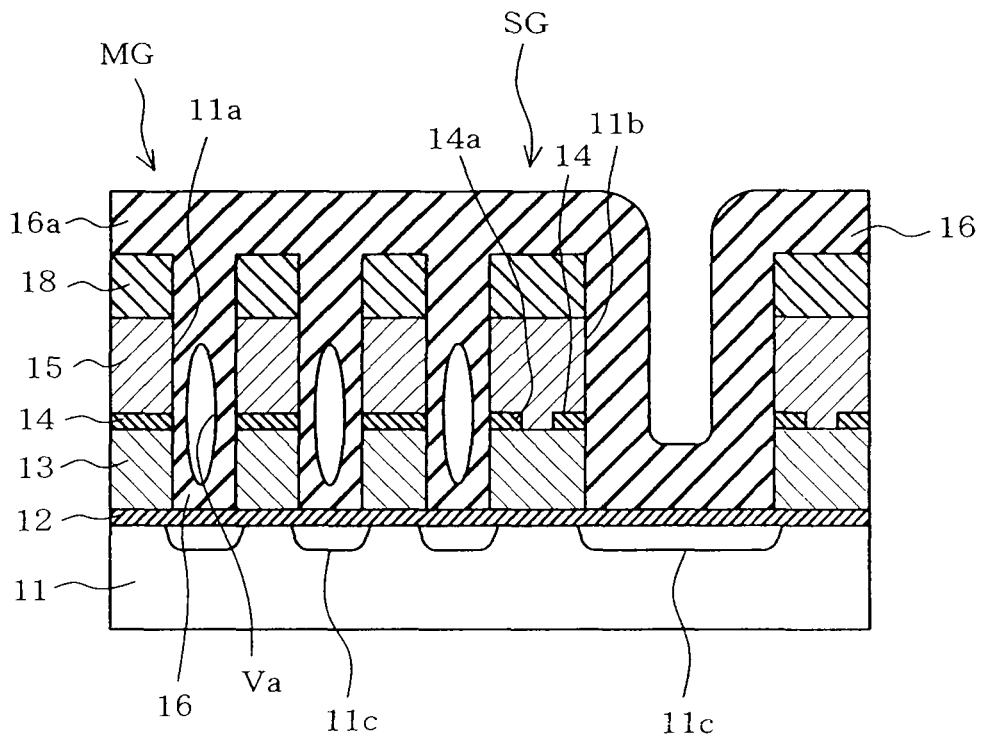

FIGS. 21A and 21B show a step of the fabrication process. The structures as shown in FIGS. 21A and 21B are obtained through the following steps. A film stack constituting the gate electrodes MG and selective gate electrodes SG is formed on the silicon substrate 11. Subsequently, the sacrificial film 18 is stacked and then etched in a line-and-space pattern by the RIE method in order that the gate electrodes MG and selective gate electrodes SG may be divided with the sacrificial film 18 serving as a mask. Next, the silicon oxide film 16 is formed on the processed film stack. An etching process is executed so that the silicon oxide film 16 is patterned so as to span portions where the gate electrodes MG are formed at narrow intervals, whereupon the structure is formed into state where the silicon oxide film 16 has been removed as shown in FIG. 21A and the state where the beams 16a have been formed as shown in FIG. 21B.

The inside of the inner wall surface Va formed by the unfilled portion is formed as a void. In most of the region which extends in the direction of word line and where no beams 16a are formed, an etch-back process is carried out till the upper end of the inner wall surface Va is open. Furthermore, as shown in FIG. 21B, each recess 11a is filled with the silicon oxide film 16 in a part where the beams 16a are to be formed, and the inner wall surface Va of the silicon oxide film 16 is exposed in the central portion of each recess 11a. However, although the inner wall surface Va of the silicon oxide film 16 is closed at the location as shown in FIG. 21B, the inner wall surface Va is continuous along the recess 11a and is open to the outside at the part as shown in FIG. 21A.

In the above-described step, the silicon oxide film 16 is etched so that the upper end of the inner wall surface Va of the silicon oxide film 16 in each recess 11a is open, as shown in FIG. 21A. However, an amount of etching may be rendered larger than described above, or the entire silicon oxide film 16 may be etched thereby to be removed except for the silicon oxide film 16 located beneath the beams 16a.

Subsequently, the silicon oxide film 17 is formed by the aforesaid condensation CVD method under the condition as shown in FIGS. 21A and 21B. As a result, the recesses 11a and 11b and the void inside the inner wall surface Va in each recess 11a is filled with the silicon oxide film 17. In this case, the beams 16a are formed from the silicon oxide film 16. Accordingly, the parts constituting the active region 3 can be rendered harder to collapse even when the active region 3 is subjected to stress in an ashing treatment for removal of resist or a wet treatment for removal of residue in the steps before the forming of the silicon oxide film 17.

For example, stress is generated by surface tension of cleaning liquid in the removal of residue by the wet treatment. Furthermore, stress is also generated when the recesses 11a are filled with the condensation CVD film for the purpose of forming the silicon oxide film 17. Even when the stress results in a force which collapse or deform the members of gate electrodes MG and selective gate electrodes SG, the beams 16a remaining between these members can suppress collapse or deformation of the members.

Figure 22A:
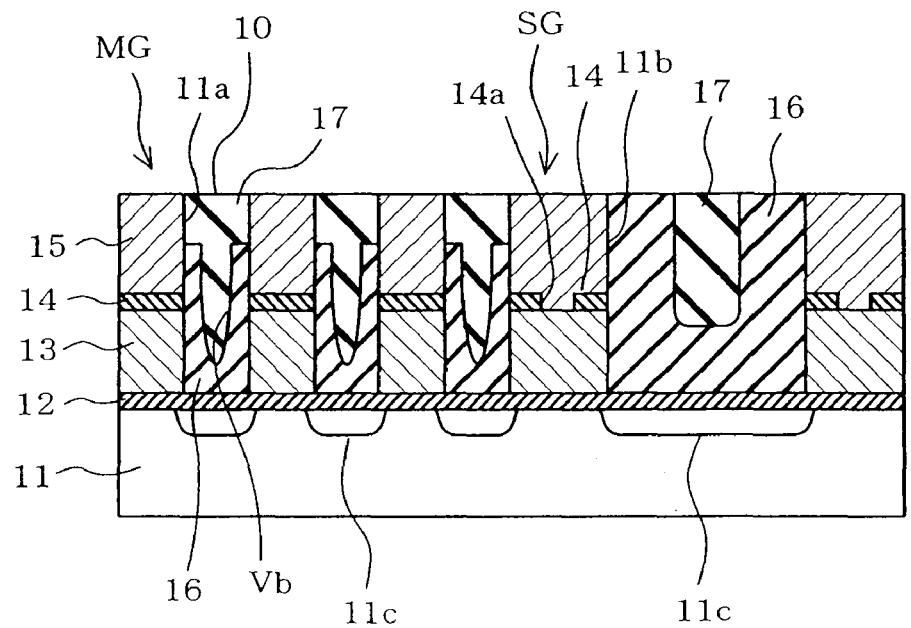
FIGS. 22A and 22B are schematic sectional views of a first part of structure where no beam is formed and a second part of structure where a beam is formed, respectively, showing a fourth embodiment.
Figure 22B:
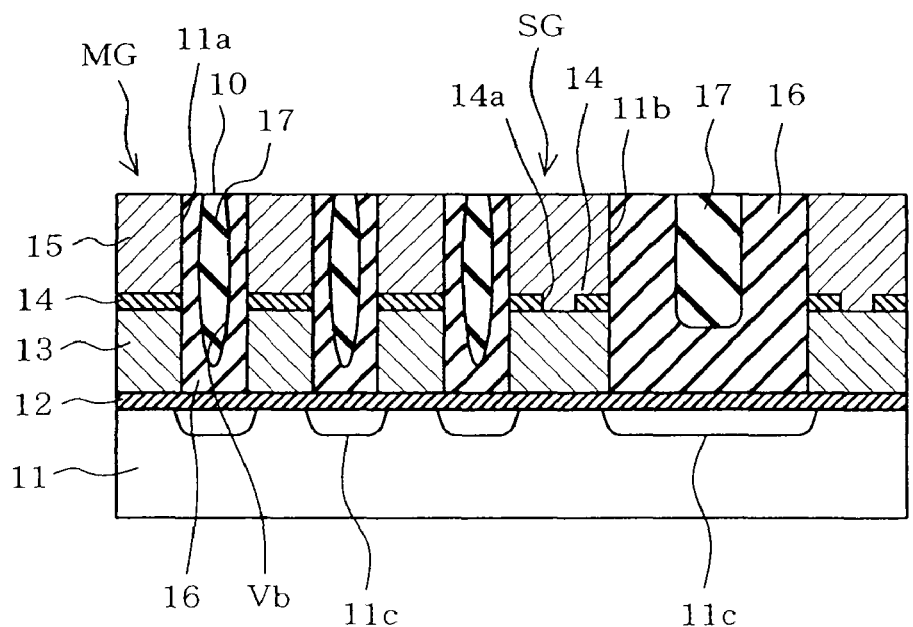
Figure 23A:
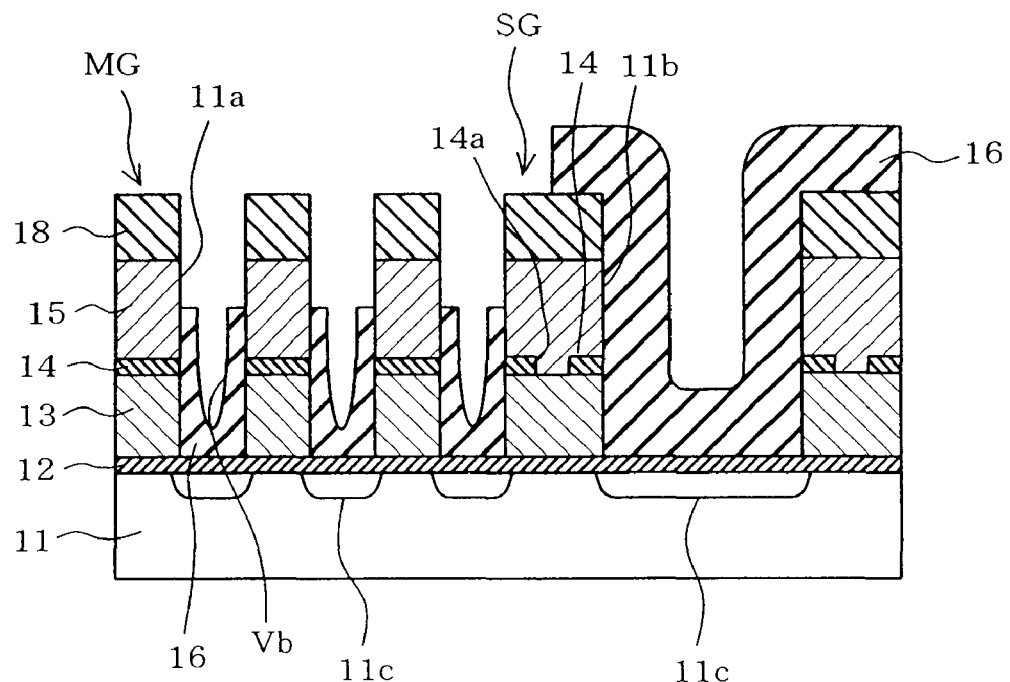
FIGS. 23A and 23B are schematic sectional views of the first part of structure where no beam is formed and the second part of structure where the beam is formed, respectively, showing another fabrication stage.
Figure 23B:
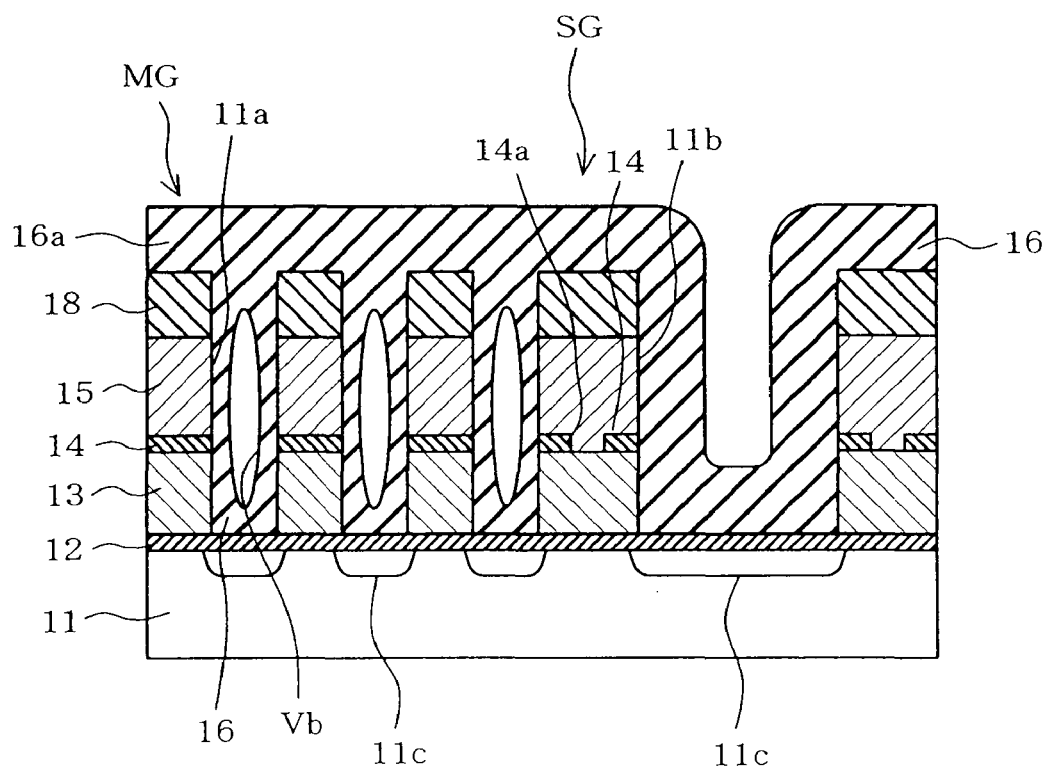

FIGS. 22A to 23B illustrate a fourth embodiment. The fourth embodiment differs from the third embodiment in that the inner wall surface Vb as shown in the second embodiment is formed by the silicon oxide film 16 in each recess 11a. FIGS. 22A and 22B show the structures corresponding to the state of the structure as shown in FIGS. 15A and 15B respectively. In the fourth embodiment, the structure shown in FIG. 22A or the part of the structure in which the silicon oxide film 16 is not left as beams has substantially the same configuration as in the third embodiment. Furthermore, FIG. 22B shows the configuration corresponding to the part of the structure in which the silicon oxide film 16 is left as beams. In the configuration of FIG. 22B, the inner wall surface Vb of the silicon oxide film 16 is formed so as to be open at the upper end thereof in each recess 11a. FIGS. 23A and 23B correspond to the structures in the processing step shown in FIGS. 21A and 21B respectively. The inner wall surface Vb of the silicon oxide film 16 below the beams 16a is left closed in each recess 11a.

In the fourth embodiment, part of the silicon oxide film 16 is left thereby to be formed into the beams 16a in the same manner as in the third embodiment. Accordingly, collapse or deformation can be suppressed in the members of gate electrodes MG and selective gate electrodes SG even when these members are subjected to stress.

The above-described embodiments are not restrictive and can be modified or expanded as follows. In the forming of the first insulating film, the inner wall surface Va or Vb of the silicon oxide film 6 or 16 formed in each trench 1a should be sized so that the upper end of the inner wall surface Va or Vb is open in the forming of the beams and so that the inside of the inner wall surface Va or Vb is filled with the second insulating film with fluidity. The inner wall surface Va or Vb has no other dimensional limitations.

Each beam formed from the first insulating film may be linear, oblique relative to the trench 1a or recess 11a, or stepwise. Thus, each beam may be formed in various shapes. Furthermore, the beams may be formed into a pattern in which the beams span portions of the structure considered to be likely to collapse or deform. Furthermore, although two beams are formed in parallel in the foregoing embodiments, the number of beams may be increased. Thus, the beams may be formed in various patterns.

As a manner of filling the inside of the inner wall surface of the silicon oxide film with the material having fluidity, the foregoing embodiments describe a manner of forming the coating film such as the polysilazane film and converting the coating film to the silicon oxide film and another manner of using the silicon film formed by the condensation CVD method. However, other coating films and materials with fluidity may be employed, instead.

Although the NAND flash memory device with the floating gate structure has been described in the foregoing embodiments, application may cover various types of NAND flash memory devices such as MONOS or SONOS type NAND flash memory devices, instead. Furthermore, application may cover various types of semiconductor devices such as NOR type flash memory devices, SRAMs or logic circuits.

The foregoing description and drawings are merely illustrative of the principles and are not to be construed in a limiting sense. Various changes and modifications will become apparent to those of ordinary skill in the art. All such changes and modifications are seen to fall within the scope as defined by the appended claims.

What is claimed is:

1. A method of fabricating a semiconductor device comprising:
    forming a plurality of trench-like recesses in a semiconductor substrate, the recesses including one or more recesses each of which has an opening width of not more than a predetermined value;
    forming a first insulating film above the semiconductor substrate after the recesses have been formed therein, whereby one or a plurality of voids are formed in said one or more recesses whose opening widths are not more than the predetermined value, the voids being formed along a direction in which the recesses are formed;
    removing part of the first insulating film so that a beam is left which has a predetermined width and spans the openings so that the beam passes over upper surfaces of said one or more recesses and so that at least the voids are exposed in a portion of the semiconductor substrate except the beam; and
    filling the voids in the recesses with a material with a predetermined fluidity, thereby forming second insulating films in the corresponding recesses.

2. The method according to claim 1, wherein in the forming of the first insulating film, the voids are formed so as to be open at locations of the upper surfaces of said one or more recesses respectively.

3. The method according to claim 1, wherein in the forming of the first insulating film, the voids are formed so as to be closed at locations of the upper surfaces of said one or more recesses respectively.

4. The method according to claim 1, wherein in the forming of the second insulating film, a coating-type insulating film is used as the material with the predetermined fluidity.

5. The method according to claim 4, wherein in the forming of the second insulating film, a polysilazane solution is applied and then converted to a silicon oxide film by a thermal treatment.

6. The method according to claim 1, wherein in the forming of the second insulating film, a condensation chemical vapor deposition film is used as the material with the predetermined fluidity.

7. The method according to claim 1, wherein in the forming of the trench-like recesses on the semiconductor substrate, a silicon substrate on which a gate insulating film and a gate electrode film are stacked is provided, and trenches are formed as the trench-like recesses, the trenches being filled with the first and second insulating films to be formed into element isolation insulating films.

8. The method according to claim 1, wherein in the forming of the trench-like recesses in the semiconductor substrate, a silicon substrate on which a gate insulating film and a gate electrode film are stacked is provided, and trench-like recesses are formed in the gate electrode film so that the gate electrode film is divided into gate electrodes, and in the forming of the first and second insulating films, the recesses formed between the divided gate electrodes are filled with the first and second insulating films so that interlayer insulating films are formed.

9. A method of fabricating a semiconductor device, comprising:
  forming a plurality of first recesses and a second recess in a semiconductor substrate as trench-like recesses, each first recess having a first width, the second recess having a second width larger than the first width;
  forming a first insulating film above the semiconductor substrate after the first and second recesses have been formed therein, whereby each first recess is filled with the first insulating film so that a void is formed therein along a direction in which the first recesses are formed, and the first insulating film is formed along inner sidewalls and a bottom of the second recess;
  processing the first insulating film so that a beam is formed so as to partially span openings of the first recesses and so that part of the first insulating film is removed to expose the voids of portions except for the beam while the first insulating film is left in the second recess; and
  filling the voids of the first recesses with a material with a predetermined fluidity, and in a case where a third recess remains after the first insulating film has been formed in the second recess, filling the third recess with the material with the fluidity, whereby a second insulating film is formed in the trench-like recesses.

10. The method according to claim 9, wherein in the forming of the first insulating film, the voids are formed so as to be open at locations of upper surfaces of the first recesses.

11. The method according to claim 9, wherein in the forming of the first insulating film, the voids are formed so as to be closed at locations of upper surfaces of the first recesses.

12. The method according to claim 9, wherein in the forming of the second insulating film, a coating-type insulating film is used as the material with the predetermined fluidity.

13. The method according to claim 12, wherein in the forming of the second insulating film, a polysilazane solution is applied and then converted to a silicon oxide film by a thermal treatment.

14. The method according to claim 9, wherein in the forming of the second insulating film, a condensation chemical vapor deposition film is used as the material with the predetermined fluidity.

15. The method according to claim 9, wherein in the forming of first and second trench-like recesses in the semiconductor substrate, a silicon substrate on which a gate insulating film and a gate electrode film are stacked is provided, and a plurality of first and second trenches are formed as the first and second trench-like recesses respectively, the first and second trenches being filled with the first and second insulating films respectively thereby to be formed into element isolation insulating films.

16. The method according to claim 9, wherein in the forming of first and second trench-like recesses in the semiconductor substrate, a silicon substrate on which a gate insulating film and a gate electrode film are stacked is provided, and the first and second trench-like recesses are formed in the gate electrode film so that the gate electrode film is divided into gate electrodes, and in the forming of the first and second insulating films, the first and second trench-like recesses formed between the divided gate electrodes are filled with the first and second insulating films so that interlayer insulating films are formed.

* * * * *